(12) United States Patent
Leendertz et al.

(10) Patent No.: US 11,552,172 B2
(45) Date of Patent: Jan. 10, 2023

(54) SILICON CARBIDE DEVICE WITH COMPENSATION LAYER AND METHOD OF MANUFACTURING

(71) Applicant: Infineon Technologies AG, Neubiberg (DE)

(72) Inventors: Caspar Leendertz, Munich (DE); Romain Esteve, Prisdorf (DE); Moriz Jelinek, Villach (AT); Anton Mauder, Kolbermoor (DE); Hans-Joachim Schulze, Taufkirchen (DE); Werner Schustereder, Villach (AT)

(73) Assignee: Infineon Technologies AG, Neubiberg (DE)

( * ) Notice: Subject to any disclaimer, the term of this patent is extended or adjusted under 35 U.S.C. 154(b) by 26 days.

(21) Appl. No.: 16/926,695

(22) Filed: Jul. 11, 2020

(65) Prior Publication Data
US 2021/0013310 A1 Jan. 14, 2021

(30) Foreign Application Priority Data

Jul. 12, 2019 (DE) .......................... 102019119020.7

(51) Int. Cl.
| | |
|---|---|
| *H01L 29/16* | (2006.01) |
| *H01L 29/06* | (2006.01) |
| *H01L 29/78* | (2006.01) |
| *H01L 29/66* | (2006.01) |
| *H01L 29/10* | (2006.01) |

(Continued)

(52) U.S. Cl.
CPC ........ *H01L 29/1608* (2013.01); *H01L 21/047* (2013.01); *H01L 29/0615* (2013.01); *H01L 29/0634* (2013.01); *H01L 29/0653* (2013.01); *H01L 29/0878* (2013.01); *H01L 29/1095* (2013.01); *H01L 29/407* (2013.01); *H01L 29/66068* (2013.01); *H01L 29/66734* (2013.01); *H01L 29/7802* (2013.01); *H01L 29/7813* (2013.01); *H01L 29/045* (2013.01);
(Continued)

(58) Field of Classification Search
CPC ............. H01L 29/0615; H01L 29/0878; H01L 29/407; H01L 29/7813; H01L 29/0619; H01L 29/7397
See application file for complete search history.

(56) References Cited

U.S. PATENT DOCUMENTS

2001/0053568 A1* 12/2001 Deboy ................ H01L 29/7802
438/138
2004/0157384 A1* 8/2004 Blanchard ........... H01L 29/0634
438/197

(Continued)

*Primary Examiner* — Bilkis Jahan
*Assistant Examiner* — Victor V Barzykin
(74) *Attorney, Agent, or Firm* — Murphy, Bilak & Homiller, PLLC

(57) ABSTRACT

First dopants are implanted through a larger opening of a first process mask into a silicon carbide body, wherein the larger opening exposes a first surface section of the silicon carbide body. A trench is formed in the silicon carbide body in a second surface section exposed by a smaller opening in a second process mask. The second surface section is a sub-section of the first surface section. The larger opening and the smaller opening are formed self-aligned to each other. At least part of the implanted first dopants form at least one compensation layer portion extending parallel to a trench sidewall.

13 Claims, 17 Drawing Sheets

(51) Int. Cl.
*H01L 29/40* (2006.01)
*H01L 29/08* (2006.01)
*H01L 21/04* (2006.01)
H01L 29/872 (2006.01)
H01L 29/739 (2006.01)
H01L 29/04 (2006.01)

(52) U.S. Cl.
CPC ...... *H01L 29/0619* (2013.01); *H01L 29/7397* (2013.01); *H01L 29/872* (2013.01)

(56) References Cited

U.S. PATENT DOCUMENTS

2009/0272982 A1* 11/2009 Nakamura ........ H01L 29/66068
257/77
2014/0159144 A1* 6/2014 Cheng ................ H01L 29/0634
257/330

* cited by examiner

SILICON CARBIDE DEVICE WITH COMPENSATION LAYER AND METHOD OF MANUFACTURING

TECHNICAL FIELD

Examples of the present disclosure relate to a silicon carbide device, in particular to a silicon carbide device with compensation layer and to methods of manufacturing silicon carbide devices with compensation layer.

BACKGROUND

The most significant difference between conventional power semiconductor devices and power semiconductor superjunction power devices is a series of lateral junctions between n doped regions and p doped regions in the voltage-sustaining layer of the superjunction power semiconductor device. A lateral depletion effect inside the voltage sustaining layer facilitates high voltage blocking capability at comparatively low on-state resistance. A prerequisite for high voltage blocking capability is sufficient charge balance between the n doped regions and the p doped regions in the voltage-sustaining layer. Fabrication of silicon superjunction devices typically includes a multi-epitaxy/multi-implant process with masked p-type doping or with both masked p-type and masked n-type doping per epitaxial layer, a multi-implant process at different implant energies, etching trenches combined with epitaxial growth in the trench, or etching trenches combined with a trench-wall gas-phase doping process. Forming compensation structures with high vertical extension and with sufficiently well-defined charge compensation gets more challenging if the diffusion coefficient of dopants in the semiconductor material is low.

There is a need for providing a silicon carbide device including a compensation structure with high vertical extension and/or well-defined charge compensation at competitive costs.

SUMMARY

An embodiment of the present disclosure relates to a method of manufacturing a silicon carbide device. First dopants are implanted into a silicon carbide body through a larger opening of a first process mask. The larger opening exposes a first surface section of the silicon carbide body. A trench is formed in the silicon carbide body in a second surface section exposed by a smaller opening in a second process mask. The second surface section is a sub-section of the first surface section. The larger opening and the smaller opening are formed self-aligned to each other. At least part of the implanted first dopants form at least one compensation layer portion extending parallel to a trench sidewall.

Another embodiment of the present disclosure relates to a silicon carbide device. The silicon carbide device includes a fill structure extending from a first lateral cross-sectional plane of a silicon carbide body to a second lateral cross-sectional plane. The fill structure includes at least one stepped sidewall. The stepped sidewall includes at least two steep sidewall portions laterally shifted to each other. Compensation layer portions are formed in the silicon carbide body. Each compensation layer portion extends along one of the steep sidewall portions.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a silicon carbide device and a method of manufacturing a silicon carbide device and together with the description serve to explain principles of the embodiments. Further embodiments are described in the following detailed description and the claims.

DETAILED DESCRIPTION

Figure 1A:
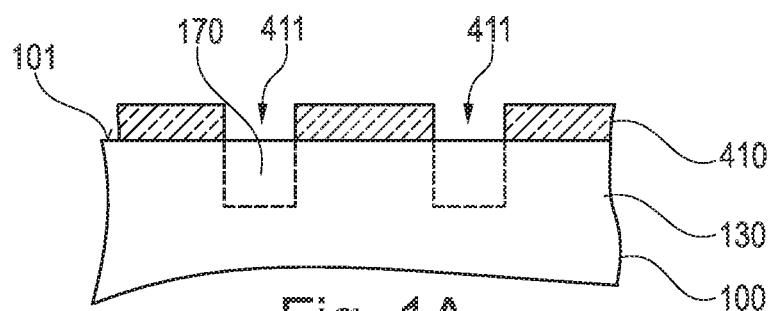
FIGS. 1A-1B show simplified vertical cross-sectional views of a portion of a silicon carbide body for illustrating a method of forming a silicon carbide device with compensation structure according to an embodiment including etching a trench into a doped auxiliary region.

In the following detailed description, reference is made to the accompanying drawings, which form a part hereof and in which are shown by way of illustrations specific embodiments in which a silicon carbide device and a method of manufacturing a silicon carbide device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state. An "ohmic contact" is a non-rectifying electrical junction with a linear or almost linear current-voltage characteristic.

The Figures illustrate relative doping concentrations by indicating "–" or "+" next to the doping type "n" or "p". For example, "n-" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa.

A charge compensating layer is a layer that at least partly compensates the charge in an adjacent complementarily doped layer or region when both layers are depleted or partly depleted. For example, the integral of the doping density along a lateral line across the charge compensating layer and the adjacent complementarily doped layer or region may be in a range from −20% to +20% of the integral of the doping along a lateral line across the more heavily doped one of the charge compensating layer and the complementarily doped layer or region. The charge compensating layer is completely depleted at least at the typical device breakthrough voltage or at a lower blocking voltage.

A charge compensating layer and one or two adjacent complementarily doped layer(s) or region(s) exhibiting the defined degree of charge compensation may form a unit cell of a compensation structure. The charge compensating layer is referred to as "compensation layer" in the following for simplicity. A section of a charge compensating layer is referred to as "compensation layer portion" in the following.

Ranges given for physical dimensions include the boundary values. For example, a range for a parameter y from a to b reads as a≤y≤b. The same holds for ranges with one boundary value like "at most" and "at least".

Main constituents of a layer or a structure from a chemical compound or alloy are such elements which atoms form the chemical compound or alloy. For example, nickel and silicon are the main constituents of a nickel silicide layer and copper and aluminum are the main constituents of a copper aluminum alloy.

The term "on" is not to be construed as meaning "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

As regards structures and doped regions formed in a silicon carbide body, a second region is "below" a first region if a minimum distance between the second region and a first surface at the front side of the silicon carbide body is greater than a maximum distance between the first region and the first surface. The second region is "directly below" the first region, where the vertical projections of the first and second regions into the first surface overlap. The vertical projection is a projection orthogonal to the first surface.

The term "power semiconductor device" refers to semiconductor devices with high voltage blocking capability of at least 30 V, for example 100 V, 600 V, 3.3 kV or more and with a nominal on-state current or forward current of at least 1 A, for example 10 A or more.

In general, a "layer" exhibits a surface extension along two orthogonal directions and an approximately uniform layer thickness orthogonal to the surface extension. The layer thickness may be smaller than, e.g., at most 10% of, the smallest linear extension along the surface extension. The surface extension of a lateral layer is parallel to a lateral plane. A layer extending parallel to a trench sidewall has a surface extension parallel to the trench sidewall and may have an approximately uniform thickness in a direction orthogonal to the trench sidewall.

According to an embodiment, a method of manufacturing a silicon carbide device may include implanting first dopants through a larger opening of a first process mask into a silicon carbide body.

The silicon carbide body may be one of several silicon carbide bodies arranged side-by-side and laterally connected to each other. The laterally connected silicon carbide bodies may be portions of a silicon carbide substrate.

The silicon carbide substrate may consist of or include a silicon carbide disc or silicon carbide wafer cut from a single-crystalline silicon carbide ingot. For example, the silicon carbide substrate may include an epitaxial layer and/or a substrate portion, wherein the substrate portion may be obtained from a single-crystalline silicon carbide ingot, e.g. by sawing or wafer splitting. A diameter of the silicon carbide substrate may correspond to a production standard for semiconductor wafers, and may be, by way of example, 4 inch (100 mm), 150 mm (6 inch), 175 mm (7 inch), 200 mm (8 inch) or even up to 300 mm (12 inch).

The material of the silicon carbide substrate may be 15R—SiC (silicon carbide of 15R polytype), 2H—SiC, 4H—SiC or 6H—SiC, by way of example. In addition to the main constituents silicon and carbon, the silicon carbide substrate may include dopant atoms, for example nitrogen N, phosphorus P, beryllium Be, boron B, aluminum Al, and/or gallium Ga. Further, the silicon carbide substrate may include unwanted impurities, for example hydrogen, fluorine and/or oxygen.

The silicon carbide substrate may have two essentially parallel main surfaces of the same shape and size and a lateral surface area connecting the edges of the two main surfaces. For example, the silicon carbide substrate may have the shape of a polygonal (e.g., rectangular or hexagonal) prism with or without rounded edges, a right cylinder or a slightly oblique cylinder, wherein some of the sides may lean at an angle of at most 8°, at most 5° or at most 3°. One or more flats or notches may be formed along the lateral surface area.

The silicon carbide substrate may laterally extend in a plane spanned by lateral directions. Accordingly, the silicon carbide body may have a surface extension along two lateral directions and may have a thickness along a vertical direction perpendicular to the lateral directions. A first surface of the silicon carbide body forms a section of a first main surface at the front side of the silicon carbide substrate.

The first process mask may be a homogeneous layer from one material or may include two or more sub-layers of different materials. For example, the first process mask may include a layer of silicon oxide and/or a layer of silicon nitride. The first process mask may be formed on, e.g. directly on, the first surface of the silicon carbide body.

The larger opening may extend vertically through the first process mask. The larger opening may expose a first surface section of the first surface. The first surface section may be planar or may include a trench. The larger opening may be stripe-shaped. Alternatively, the larger opening may be a regular polygon with or without rounded or beveled corners, a circle, or an oval, by way of example.

The first dopants may be implanted into an implant region in a way such that a distribution of the implanted first dopants along the vertical direction is uniform to a high degree, e.g. over at least 50% or even at least 70% or even at least 80% of the vertical extension of the implant region. In other words, a vertical dopant distribution in the compensation layer portion may be approximately uniform (so-called "box-shaped" distribution), e.g. over at least 50% (or 70% or 80%) of the vertical extension of the implant region. For example, implanting the first dopants may include a high energy implant through an energy filter. The implanted dopants may have an approximately uniform energy distribution between a minimum energy and a maximum energy and/or the implanted dopants distribute approximately uniformly along the vertical direction. According to other embodiments, implanting the first dopants may include at least one of: (i) channeled ion beam implantation, (ii) ion beam implantation at a plurality of different acceleration voltages, (iii) ion beam implantation at a plurality of different implant angles. With each of these methods, it may be possible to approximate a box-shaped vertical dopant profile to some degree. A vertical homogeneous doping level may mean that the difference in the doping level in this region is less than 60% or less than 40% or even less than 20% of a maximum doping level in this region.

Prior to or subsequent to implanting the first dopants, a trench may be formed in a second surface section of the first surface of the silicon carbide body. The trench may be circle shaped, polygon shaped or stripe shaped and may laterally extend from one side of a central active region of the silicon carbide body to the opposite side. The central active region may include functional transistor cells of a power semiconductor device, or the anode region(s) of a power semiconductor diode or MPS (merged pin Schottky) diode.

Alternatively, the trench may be a needle trench with two orthogonal lateral extensions within the same order of magnitude. For example, a needle trench may have two equal or approximately equal orthogonal lateral extensions. The trench may have at least one steep trench sidewall. For example, the trench sidewall may include one, two or more steep sidewall sections. The steep sidewall sections may be vertical or may deviate from the vertical direction by up to ±10 degree, by way of example.

The second surface section may be exposed by a smaller opening in a second process mask. The second surface section may be a true sub-section of the first surface section. In other words, a lateral area of the second surface section may be smaller than a lateral area of the first surface section. The second surface section may be a central section of the first surface section. For example, the second surface section and the first surface section may be concentric and/or may have a common central region (e.g., a common center line or a common center).

A lateral cross-sectional area of the larger opening is greater than a lateral cross-sectional area of the smaller opening in the same cross-sectional plane. The smaller opening and the larger opening may be formed self-aligned to each other. For example, the positions of both the larger opening and the smaller opening may be defined by one single photolithography process. In other words, it is possible that the position of the larger opening with respect to the smaller opening is independent from any alignment process adjusting a follower photomask to an alignment mark defined by a predecessor photomask on the silicon carbide substrate.

At least part of the implanted first dopants may form at least one compensation layer portion extending parallel to the trench sidewall, for example parallel to a steep sidewall section of the trench. A dopant distribution in the compensation layer portion along the vertical direction may be uniform to a high degree, e.g. over at least 50% or even at least 70% or even at least 80% of a vertical extension of the compensation layer portion. For example, a vertical dopant distribution in the compensation layer portion may be approximately uniform ("box-shaped"), e.g. over at least 50% (or 70% or 80%) of the vertical extension of the compensation layer portion.

With the self-aligned formation of the larger opening and the smaller opening with respect to each other, the thickness of and the total amount of charges in the compensation layer portion may be independent from mask alignment tolerances. Mask alignment tolerances may be significant for some substrates. For example, mask alignment tolerances may be significant on substrates like 4H—SiC provided with an off-axis cut. On substrates with off-axis cut, the surfaces on which alignment marks are formed are tilted to the main lattice planes. The off-axis cut may enhance surface distortions and may degrade any alignment mark formed thereupon.

With the self-aligned approach, the amount of implanted first dopants in the compensation layer portion may be precisely defined at high reproducibility. It is possible to provide a superjunction structure with a narrow tolerance window for a degree of charge balance across the complete vertical extension of the superjunction structure or across at least 50% of the vertical extension of the superjunction structure. Avalanche and breakdown behavior of silicon carbide superjunction devices may be precisely predictable.

The compensation layer portions may have a comparatively narrow lateral width such that it is possible to provide neighboring first compensation layers at a comparatively small center-to-center distance. The process may also facilitate the vertical stacking of compensation layer portions in a stepwise manner without intermediate epitaxy. As a result, it may be possible to provide superjunction structures with comparatively large vertical extension at comparatively low effort.

According to an embodiment, the first dopants may be implanted prior to forming the trench. The smaller opening may be formed by forming a spacer along a sidewall of the larger opening. In other words, the second process mask for forming the trench may include the first process mask, which has been used for implanting the first dopants, and a spacer along a sidewall of the larger opening. In this way it is possible to obtain self-aligned first and smaller openings at comparatively low effort.

According to an embodiment, forming the trench and the compensation layer portions may include repeating at least once an implant/etch sequence. That is to say, forming the compensation layer portions may include at least two implant/etch sequences: a first implant/etch sequence (e.g., as described above) and repeating said implant/etch sequence in at least one further implant/etch sequence. In general, n implant/etch sequences may be performed, with n=1, . . . , nmax, nmax≥2.

The implant/etch sequences may include one or more additional processes between the implant process and the etch process and/or one or more additional processes between two successive implant/etch sequences. For example, each implant/etch sequence may include a heat treatment between the implant process and the etch process.

The implant/etch sequence may include implanting first dopants through a larger opening and forming a trench section in a section exposed by a smaller opening. A lateral cross-sectional area of the smaller opening of the n-th implant/etch sequence may be smaller than the lateral cross-sectional area of the larger opening of the n-th implant/etch sequence. The first and the smaller openings used in the same implant/etch sequence may be formed self-aligned to each other. For example, the smaller opening may be formed by forming a spacer along a sidewall of the larger opening.

A lateral cross-sectional area of the larger opening of the (n+1)-th implant/etch sequence may be as large as or smaller than the lateral cross-sectional area of the smaller opening of the n-th implant/etch sequence. For example, the larger opening of the (n+1)-th implant/etch sequence may correspond to the smaller opening of the n-th implant/etch sequence. For example, the implant/etch sequence may be repeated once or twice, that is to say, two or three implant/etch sequences may be performed overall (i.e., nmax=2 or nmax=3, respectively). According to another embodiment four or more implant/etch sequences may be performed (nmax≥4).

By repeating at least once the implant/etch sequence, at least a first trench sidewall may be formed with a staircase shape. The staircase shape may facilitate the formation of a superjunction structure with comparatively large vertical extension in a semiconductor material with low diffusion coefficients for dopants. The stepped trenches may facilitate compensation structures with a vertical extension beyond an upper limit for high-energy implants through a flat main surface. In particular, providing a trench with a stepped trench sidewall may increase the vertical extension of doped regions, which may be formed by an implantation process that uses an energy filter, channeling, variable tilt angle and/or variable implant energy.

A compensation structure with high vertical extension may facilitate silicon carbide power devices that combine high voltage breakdown capability with low on-state resistance. In particular, in silicon carbide devices with a blocking voltage at least 1.2 kV, e.g., at least 1.6 kV or at least 3 kV, the on-state resistance of the voltage-sustaining layer may dominate the on-state losses. Providing the voltage-sustaining layer with a compensation structure may therefore effectively reduce the on-state losses.

In addition, the method may get along without any intermediate epitaxial layer formation or may facilitate reducing the number of intermediate epitaxial layers. Portions of a compensation structure of a silicon carbide body can be formed in a self-aligned manner and without evaluating alignment marks in different floors. With the self-aligned approach it may be possible to form comparatively narrow compensation layer portions. It is also possible to provide neighboring first compensation layers at a comparatively small center-to-center distance and with comparatively high dopant concentration.

The dopant concentration in compensation layer portions formed in different floors may be different. Different mean dopant concentrations of compensation layer portions in different floors may contribute in precisely shaping the electric field in the blocking mode of the silicon carbide device. For example, shifting the electric field maximum towards the vertical center of the superjunction structure may reduce or avoid TRAPATT (trapped plasma avalanche-triggered transit) oscillations in the silicon carbide device.

According to an embodiment, further first dopants may be implanted through a trench bottom of the trench. The further first dopants may form a compensation bottom region that extends from the trench bottom into the silicon carbide body. A lateral width of the compensation bottom region and a lateral width of the trench bottom may be equal. In other embodiments, the lateral width of the compensation bottom region may be larger than the lateral width of the trench bottom, e.g. due to at least one of straggling, channeling, diffusion and angle effects. The compensation bottom region may further increase the vertical extension of a superjunction structure. The compensation bottom region may have a box-shaped vertical dopant profile. A mean dopant concentration in the compensation bottom region may be equal to or may deviate from the mean dopant concentration in a neighboring compensation layer portion.

According to another embodiment, the first dopants may be implanted after forming the trench. For example, after completing the formation of the trench, the second process mask with the smaller openings may be replaced with the first process mask that includes the larger openings, wherein the larger openings may be formed self-aligned to the smaller openings.

For example, after forming the trench and prior to removing the second process mask, an alignment structure may be formed. The alignment structure may be placed in, e.g. may fill, the smaller opening in the second process mask. The second process mask may be removed. An auxiliary spacer may be formed along the sidewall of the exposed upper section of the alignment structure. A first process mask layer may be deposited. A planarizing process may remove portions of the first process mask layer deposited above the alignment structure and the auxiliary spacer. The alignment structure and the auxiliary spacer may be removed selectively with respect to the first process mask layer.

According to another example, the smaller opening of the second process mask may be widened to form the first process mask with the larger opening. For example, wet etching or selectively removing an initial spacer formed prior to the first trench etch may widen the smaller opening.

By implanting the first dopants after completion of the trench, for example after forming a trench with stepped trench sidewalls and with two or more trench sections of different width, it may be possible to form compensation layer portions in different floors and a compensation bottom region by one single implant process in a cost-effective way.

According to an embodiment the larger opening may be formed by widening the smaller opening, for example by wet etching. In this way, the larger openings may be formed at comparatively low-effort.

According to an embodiment, forming the trench may include repeating at least once an etch sequence, wherein the etch sequence includes forming a trench section in a section of the silicon carbide body exposed by a smaller opening. The smaller opening of the (n+1)-th etch sequence may be smaller than the smaller opening of the n-th etch sequence. In this way, it may be possible to form compensation layer portions in different floors and a compensation bottom region by one single implant process.

According to an embodiment, the smaller opening of the (n+1)-th etch sequence may be formed by forming a spacer along a sidewall of the smaller opening of the n-th etch sequence. In this way, it may be possible to form trenches with stepped sidewalls with precisely defined step width in a cost-effective way.

According to an embodiment, auxiliary dopants may be implanted into the silicon carbide body. The auxiliary dopants and the first dopants may have complementary conductivity types.

Implanting the auxiliary dopants may include an ion beam implantation with the ion beam tilted with respect to a vertical direction. The implanted auxiliary dopants may form compensation adjustment regions at opposite sides of each trench section. In the compensation adjustment regions, the mean net dopant concentration may be higher than in the main layer in the same floor.

Each compensation adjustment region may be in contact with two vertically neighboring compensation layer portions. For example, the auxiliary dopants may be implanted into the bottom of the n-th trench section before forming the trench section of the (n+1)-th implant/etch sequence. Each compensation adjustment region may be directly below a compensation layer portion along the n-th trench section and laterally next to a compensation layer portion along the (n+1)-th trench section.

The compensation adjustment regions may smooth discontinuities, which the degree of charge balance may show along the vertical direction at the steps of the stepped trench sidewall. Steep changes of the degree of charge balance may result in local peaks of the electric field strength in a blocking mode of the silicon carbide device. Smoothing charge balance discontinuities may reduce local maxima of electric field strength and may contribute in improving, e.g., the blocking capability of the devices.

According to an embodiment, the silicon carbide body may include a main layer. The main layer and the compensation layer portions may have complementary conductivity types. The trench may extend into the main layer. Compensation regions may, for example, be formed by portions of the main layer laterally between neighboring trenches. The compensation regions may further include portions of the main layer laterally between neighboring compensation bottom portions.

The compensation bottom region and the compensation layer portions assigned to the same trench may form one p-type column or layer. One compensation region may form one n-type column or layer. Alternatively, the compensation bottom region and the compensation layer portions assigned to the same trench may form one n-type column or layer and one compensation region may form one p-type column or layer. A plurality of laterally arranged n-type and p-type columns or layers may form a superjunction structure at least in the central active region of the silicon carbide device.

According to an embodiment, a transistor cell (e.g., a plurality of transistor cells) may be formed. The transistor cell may include a source region and a body region. The source region and the body region may form a pn junction. The source region and the body region may be formed between a first surface of the silicon carbide body and the compensation layer portions. The transistor cell may be an insulated gate field effect transistor cell or a junction field effect transistor cell, by way of example. It is possible to provide power semiconductor switching devices, for example MOSFETs (metal oxide semiconductor field effect transistors) with a superjunction structure.

According to an alternative embodiment, an anode region may be formed between the first surface and the compensation layer portions. It may be possible to form power semiconductor diodes with the anode region. The anode region and the compensation layer portions may have the same conductivity type. The anode region and the compensation regions may form a main pn junction of the power semiconductor diode. The anode region may include a single doped well or may be patterned by doped regions with a conductivity type opposite to the conductivity type of the anode region. The oppositely doped regions may extend from the first surface to the compensation regions. The oppositely doped regions and a front side electrode may form Schottky contacts. In this way it may be possible to provide high-voltage MPS diodes with superjunction structure.

According to an embodiment, supplementary dopants may be implanted into the silicon carbide body after forming the trench. The supplementary dopants and the compensation layer portions may have the same conductivity type. Implanting the supplementary dopants may include an ion beam implantation with the ion beam tilted with respect to the vertical direction. The implanted supplementary dopants may form compensation connection regions.

For example, the trench sections may be formed to completely or nearly completely cut through the auxiliary regions. As a result, compensation layer portions formed along the sidewalls of neighboring trench sections may be disconnected from each other or may be only weakly connected. The compensation connection regions may reliably connect compensation layer portions assigned to neighboring trench sections. In this way it is possible to provide superjunction structures with each compensation layer portion electrically connected to a defined electric potential, for example to the anode potential of a power semiconductor diode or to the emitter potential of a power semiconductor switching device. Continuous doping in the compensation layer portions may contribute in avoiding delayed and/or lossy turn-on behavior of the silicon carbide device.

According to another embodiment, a silicon carbide device may include a fill structure and compensation layer portions. The fill structure may extend from a first lateral cross-sectional plane of a silicon carbide body to a second lateral cross-sectional plane.

The silicon carbide body may have two opposite main surfaces extending along lateral directions and a lateral surface area that connects the edges of the two main surfaces. A thickness of the silicon carbide body is measured along a vertical direction orthogonal to the lateral directions.

The fill structure may be stripe-shaped. For example, the fill structure may laterally extend from one side of a central active region of the silicon carbide device to the opposite side. According to another example, the fill structure may be needle-shaped with two orthogonal lateral extensions within the same order of magnitude. For example, two orthogonal lateral extensions of a needle-shaped fill structure may be equal or approximately equal. A lateral cross-section of a needle-shaped fill structure may be a regular polygon with or without rounded or beveled corners, a circle, or an oval by way of example.

The fill structure may have at least one stepped sidewall. The stepped sidewall may include at least two steep sidewall portions laterally shifted to each other. In a vertical cross-sectional plane orthogonal to the stepped sidewall, the stepped sidewall may show a staircase pattern with the steep sidewall portions forming the risers (German: Setzstufen) and with flat sidewall portions forming the treads (German: Auftritte). The steep sidewall portions may be vertical or approximately vertical, wherein an angle between each steep sidewall portion and the vertical direction may be in a range from 0 degree to ±10 degree. The flat sidewall portions may be lateral or approximately lateral, wherein an angle between each flat sidewall portion and the lateral plane may be in a range from 0 degree to ±10 degree. Each flat sidewall portion connects two vertically neighboring steep sidewall portions. The stepped sidewall may include one, two, three or more steps. In other words, each sidewall portion may include one, two, three or more flat sidewall portions.

The compensation layer portions may be doped regions in the silicon carbide body. Each compensation layer portion may extend along one of the steep sidewall portions. For example, compensation layer portions may be formed along each steep sidewall portion. Each compensation layer portion may extend from one vertical end of a steep sidewall portion to the other vertical end of the steep sidewall portion. In other words, the compensation layer portion may extend along the complete steep sidewall portion. A vertical dopant distribution within each compensation layer portion may be approximately uniform ("box-shaped"). The mean dopant concentrations in vertically neighboring compensation layer portions may be equal or may be different.

The staggered arrangement of vertically neighboring compensation layer portions facilitate formation of superjunction structures with a vertical extension which is greater than the maximum projected range for the implanted species in the silicon carbide body for a given maximum implant energy. In addition, the laterally staggered arrangement of steep compensation layer portions may facilitate a highly variable fine-tuning of the charge balance along the vertical direction.

According to an embodiment the fill structure may include two stepped sidewalls on opposite sides of the fill structure. For example, the fill structure may be symmetric with respect to a vertical plane of symmetry, wherein the plane of symmetry is in in the center of the fill structure and may extend parallel to a lateral longitudinal extension of the fill structure.

Stepped sidewalls at opposite sides may facilitate the formation of laterally shifted compensation layer portions in different floors of the silicon carbide body in an efficient way.

According to an embodiment a compensation bottom region may be formed in the silicon carbide body. The compensation bottom region may be in contact with a bottom surface of the fill structure. For example, a lateral extension of the compensation bottom region and a lateral width of the bottom surface of the fill structure may be equal or approximately equal (e.g., within a tolerance of ±10% or ±5%). A vertical distribution of the dopants in the compensation bottom region may be approximately uniform. The compensation bottom region may further increase the vertical extension of a superjunction structure, wherein the charge balance along the complete vertical extension of the superjunction structure may be precisely defined at comparatively low effort.

According to an embodiment, the compensation bottom region and the compensation layer portions are structurally connected with each other. The fill structure, the compensation bottom region and the compensation layer portions adjoining the fill structure may form one n-type column or layer or one p-type column or layer of a superjunction structure. It is possible, to electrically connect the complete p-type column or n-type column to a defined potential by electrically connecting only one single of the compensation layer portions to the defined potential. In case the silicon carbide device is or includes an MOSFET, the defined potential may be the source potential of the silicon carbide device. Delayed and/or lossy turn-on behavior of the MOSFET may be avoided by the proposed superjunction structure.

According to an embodiment, the fill structure includes at least one dielectric structure. The dielectric structure may contribute in avoiding that the fill structure adversely affects the breakdown voltage capability of the silicon carbide device.

According to an embodiment, compensation regions may be formed in the silicon carbide body. The compensation regions may be in contact with the compensation layer portions, wherein each compensation layer portion may be laterally between the fill structure and one of the compensation regions. The compensation layer portions and the compensation regions may form stepped, vertical pn junctions. For example, a compensation region may form one n-type column or layer or one p-type column or layer. The compensation layer portions and the compensation bottom region adjoining a same fill structure may form one oppositely doped column, e.g., a p-type column for n-type compensation regions or an n-type column for p-type compensation regions. A plurality of such p-type and n-type columns arranged side-by-side may form a superjunction structure. One p-type column and one n-type column that directly adjoins the p-type column may form a unit cell of the superjunction structure. Along a lateral line through the unit cell, the line integral across the doping density of the p type dopants may be in a range from −20% to +20% of the line integral across the doping density of the n type dopants.

The compensation regions may include differently doped sub-regions, wherein each sub-region is in contact with another compensation layer portion. The sub-regions of the compensation regions may result from differently doped sub-layers (floors) of the main layer.

According to an embodiment, an emitter region may be formed in the silicon carbide body. The emitter region and the compensation layer portions may have the same conductivity type. The emitter region may be formed between a first surface of the silicon carbide body and the first lateral cross-sectional plane. For example, a p-doped emitter region may include the anode region of a power semiconductor diode or may include the body regions of transistor cells. The superjunction structure may be part of a power semiconductor diode with high blocking voltage capability or part of a power semiconductor switching device, for example a MOSFET, with high blocking voltage capability. For example, the voltage blocking capability of the silicon carbide device may be at least 1.2 kV, e.g., at least 1.6 kV or at least 3 kV.

According to an embodiment, a compensation connection region may connect two neighboring compensation layer portions. The compensation connection region and the compensation layer portions may have the same conductivity type. The compensation connection region may connect two vertically neighboring compensation layer portions.

According to an embodiment, a compensation adjustment region may be in contact with two neighboring compensation layer portions. The compensation adjustment region and the compensation layer portions may have complementary conductivity types. Each compensation adjustment region may be in contact with two vertically neighboring compensation layer portions. The compensation adjustment regions may contribute in smoothing discontinuities of the charge balance in the vicinity of the steps between neighboring steep sidewall portions of the fill structure.

FIGS. 1A-6B concern methods of forming a compensation structure with compensation regions of a first conductivity type and with compensation layer portions of a second conductivity type. The first conductivity type may be the n-type and the second conductivity type may be the p-type. The compensation regions and the compensation layer portions may form a regular pattern of lateral pn junctions.

The methods include a combination of masked ion implantation and masked trench etching. Openings in the mask for ion implantation and openings in the mask for trench etching may be formed self-aligned to each other. In FIGS. 1A-1B, 3A-3N and 4A-4D etching trenches follows implanting ions. In FIGS. 2A-2B and 6A-6C implanting ions follows etching trenches.

FIG. 1A shows a silicon carbide body 100 and a first process mask 410 formed on a first surface 101 of the silicon carbide body 100. The silicon carbide body 100 may be a portion of a silicon carbide substrate. The silicon carbide substrate may include a plurality of silicon carbide bodies arranged side-by-side and laterally connected to each other. From each silicon carbide body 100 the semiconductor die (chip) of one power semiconductor device may be formed. The first surface 101 of the silicon carbide body 100 may be a section of a main surface at a front side of the silicon carbide substrate.

The silicon carbide body 100 may include a doped main layer 130. The main layer 130 may be formed by epitaxy. The main layer 130 may have a first conductivity type. For example, the main layer 130 may be n-doped. The first process mask 410 may include one single homogeneous layer or may include two or more sub-layers from different materials. Larger openings 411 in the first process mask 410 expose first surface sections of the first surface 101.

First dopants are implanted through the larger openings 411 into the silicon carbide body 100. For example, an ion beam may be directed onto the first surface 101. The first dopants form doped auxiliary regions 170 in sections of the silicon carbide body 100 below the larger openings 411. The auxiliary regions 170 have a second conductivity type. The auxiliary regions 170 and the main layer 130 may form pn junctions. The ion beam may be controlled and/or modified to generate an approximately uniform vertical distribution of the first dopants in the auxiliary regions 170.

A second process mask 420 is formed. The second process mask 420 may be formed by modifying the first process mask 410. For example, the larger openings 411 may be transformed into smaller openings 421. A lateral cross-section of the smaller openings 421 is smaller than a lateral cross-section of the larger openings 411. For circular openings, the diameter of the smaller openings 421 is smaller than the diameter of the larger openings 411. For rectangular openings with or without rounded or beveled corners, at least one lateral width of the smaller openings 421 is smaller than a corresponding lateral width of the larger openings 411. The first and smaller openings 411, 421 may be concentric or approximately concentric.

For example, each smaller opening 421 may be formed by forming a spacer 431 along the inner sidewall of a larger opening 411. Forming the spacer 431 may include depositing a conformal auxiliary layer on the first process mask 410. The auxiliary layer is sufficiently thin to not completely fill the larger openings 411. A directed etching process may remove lateral portions of the auxiliary layer on the first process mask 410 and on the first surface 101. Residuals of the auxiliary layer form the spacers 431 along the inner sidewalls of the larger openings 411 of FIG. 1A.

Figure 1B:
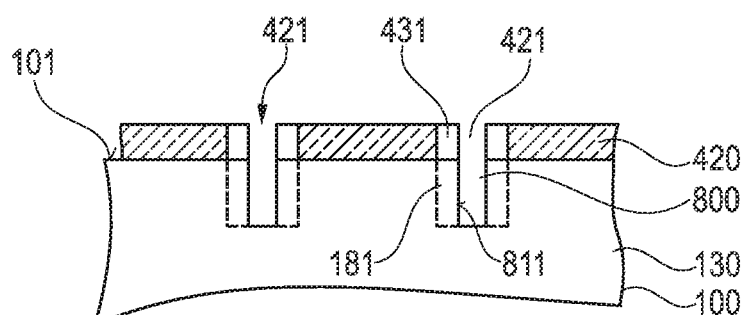

FIG. 1B shows the second process mask 420 with the smaller openings 421. The smaller openings 421 expose second surface sections of the first surface 101 and are preferentially self-aligned to the larger openings 411 of FIG. 1A. The second surface sections are central sub-sections of the first surface sections.

Trenches 800 are formed in the silicon carbide body 100 directly below the smaller openings 421. Forming the trenches 800 may include anisotropic etching, for example reactive ion beam etching. A vertical extension of the trenches 800 may be equal to or smaller than a vertical extension of the auxiliary regions 170. Forming the trenches 800 includes removing a central portion of each auxiliary region 170. Residual portions of each auxiliary region 170 form compensation layer portions 181. Each compensation layer portion 181 extends along a steep sidewall section 811 of the trench 800.

Figure 2A:
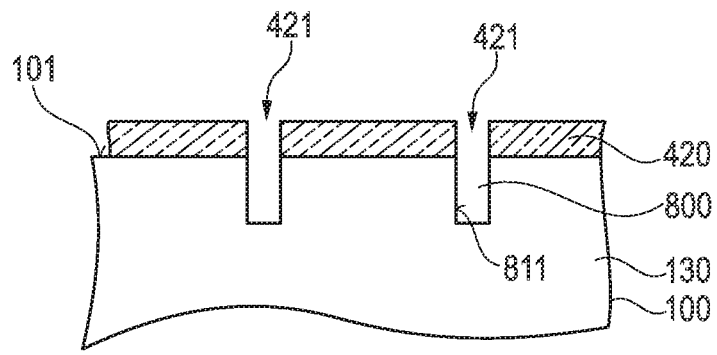
FIGS. 2A-2B show simplified vertical cross-sectional views of a portion of a silicon carbide body for illustrating a method of forming a silicon carbide device with compensation structure according to an embodiment including a vertical implant in sidewall regions of a trench.

FIG. 2A shows trenches 800 formed in a main layer 130 of a silicon carbide body 100 directly below smaller openings 421 of a second process mask 420. A first process mask 410 with larger openings 411, which are wider than the smaller openings 421, may be formed. For example, an isotropic etch, e.g., a wet etch, may laterally recess the second process mask 420, wherein the smaller openings 421 transform into the larger openings 411. First dopants are implanted through the larger openings 411 into the silicon carbide body 100.

Figure 2B:
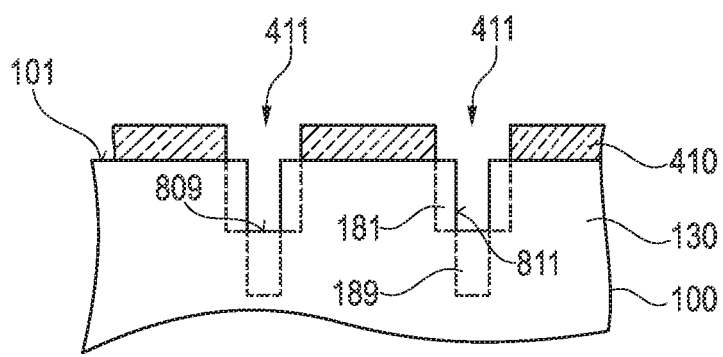

According to FIG. 2B, the implanted first dopants form compensation layer portions 181 directly below the first surface 101 and extending along steep sidewall sections 811 of the trench 800. In addition, the first dopants form compensation bottom portions 189 below the trenches 800. Each compensation bottom portion 189 extends from a trench bottom 809 into the main layer 130.

Figure 3A:
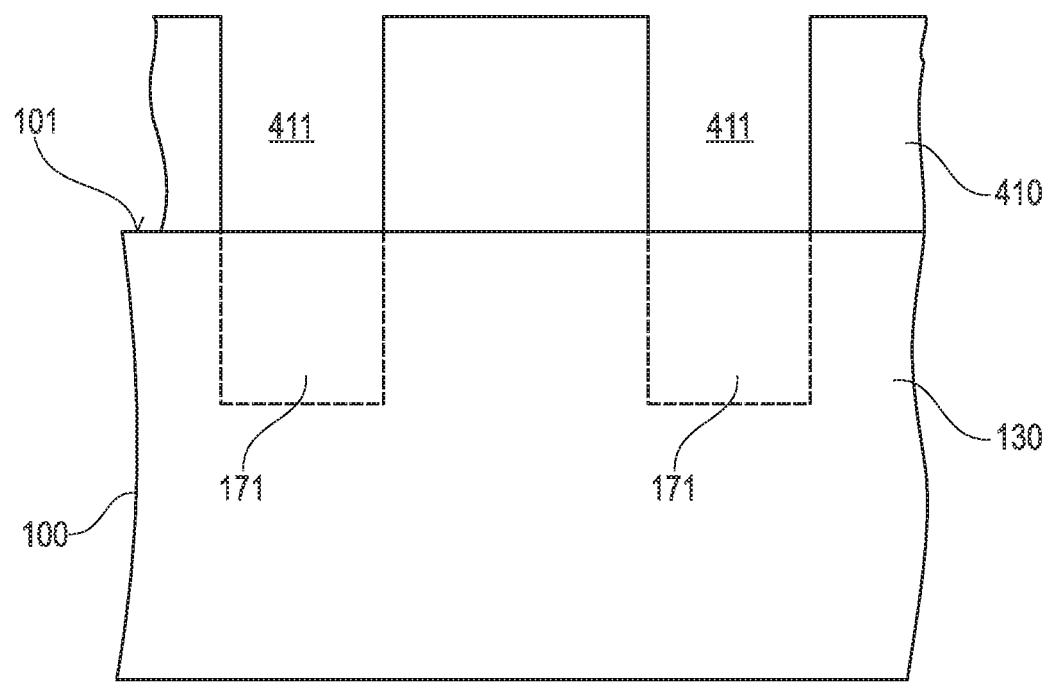
FIGS. 3A-3N show simplified vertical cross-sectional views of a portion of a silicon carbide body for illustrating a method of forming a silicon carbide device witch trench gate structures according to an embodiment using spacers.
Figure 3B:
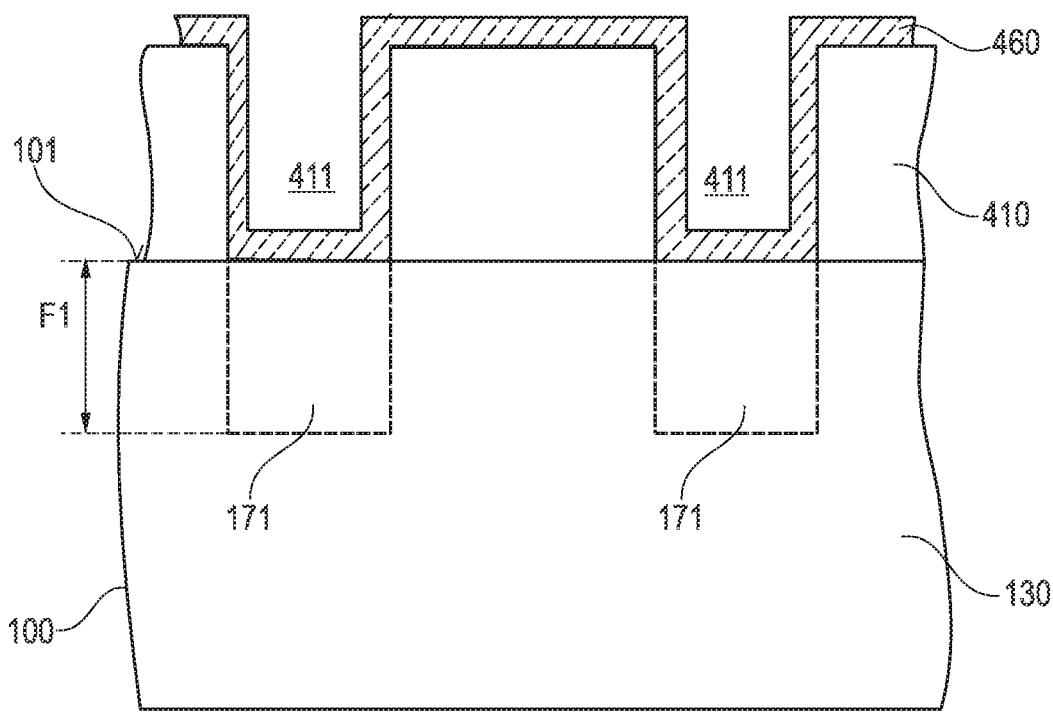
Figure 3C:
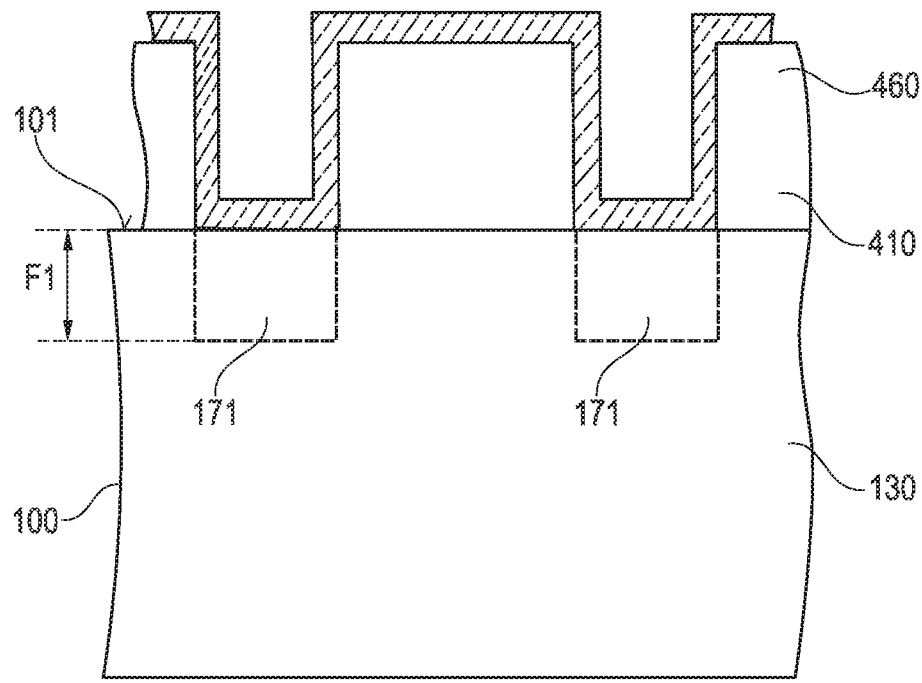
Figure 3D:
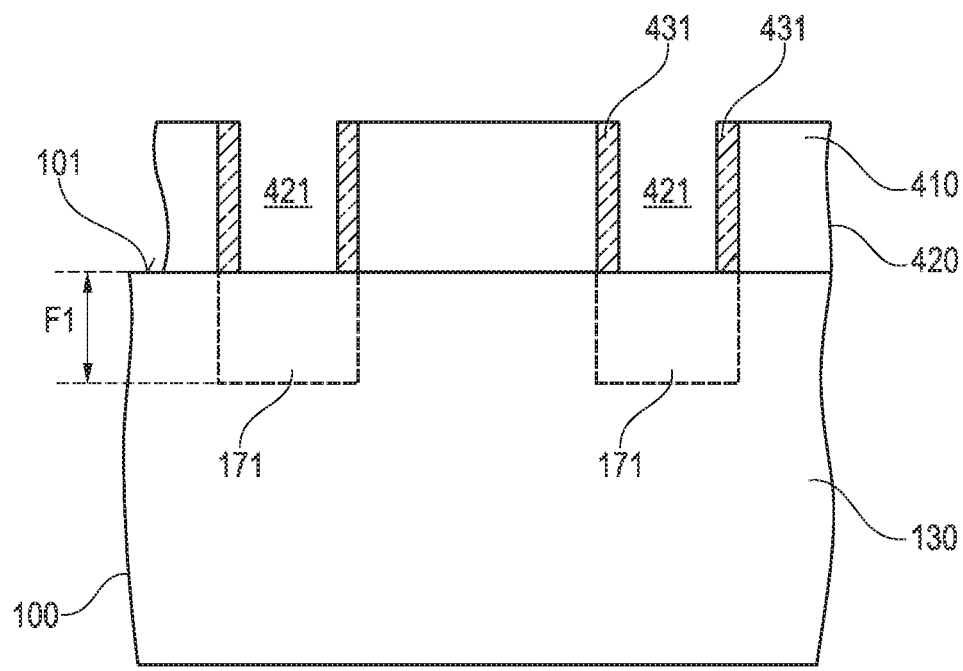
Figure 3E:
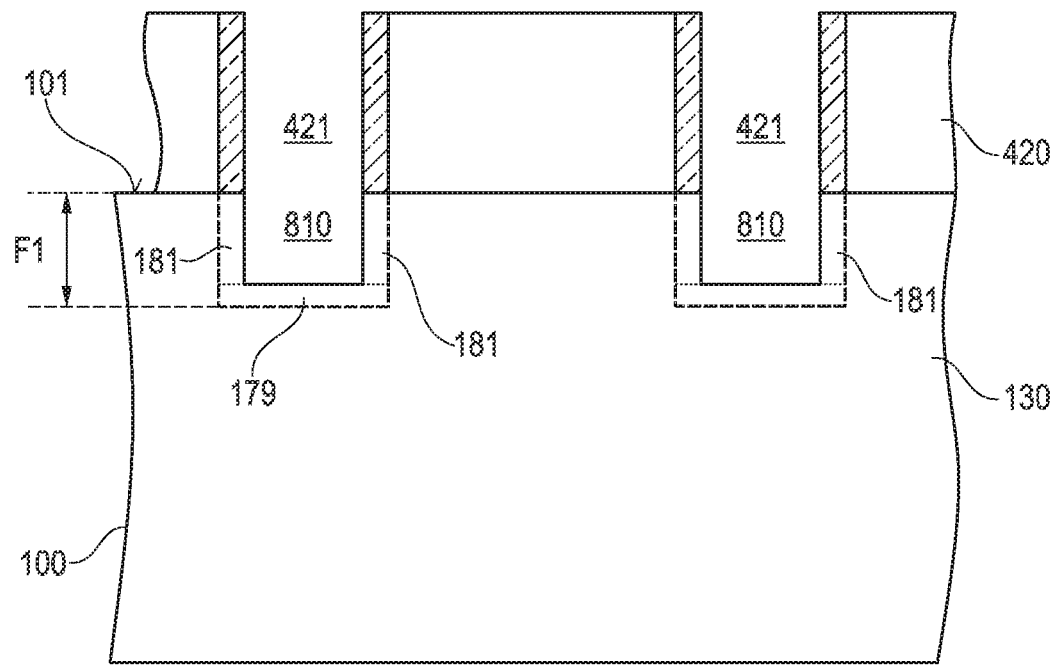
Figure 3F:
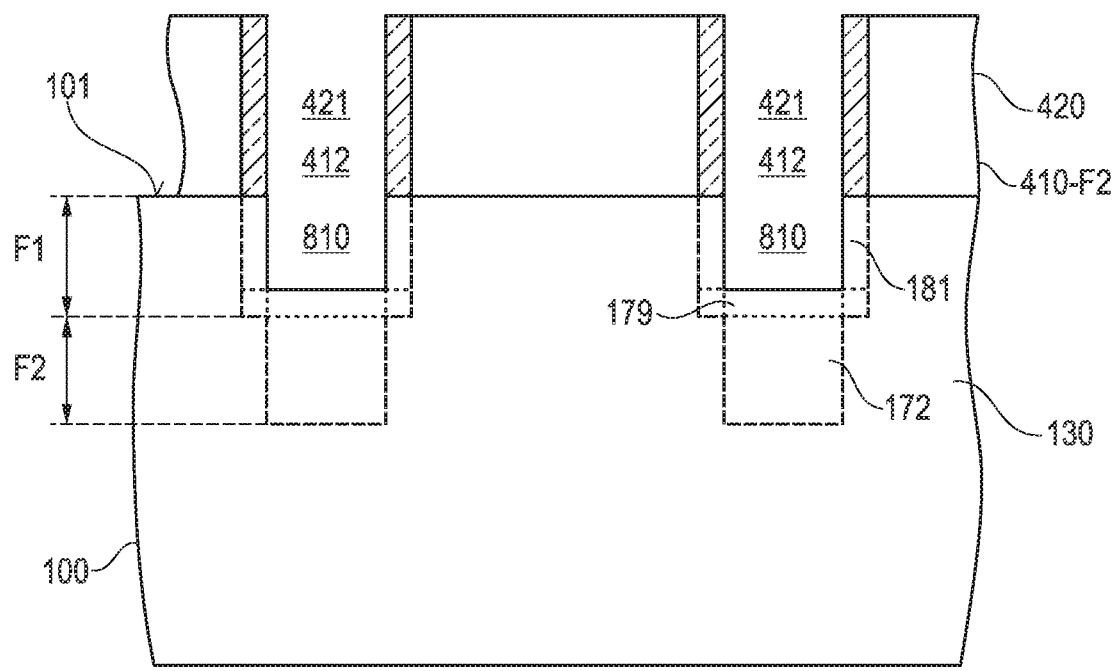
Figure 3G:
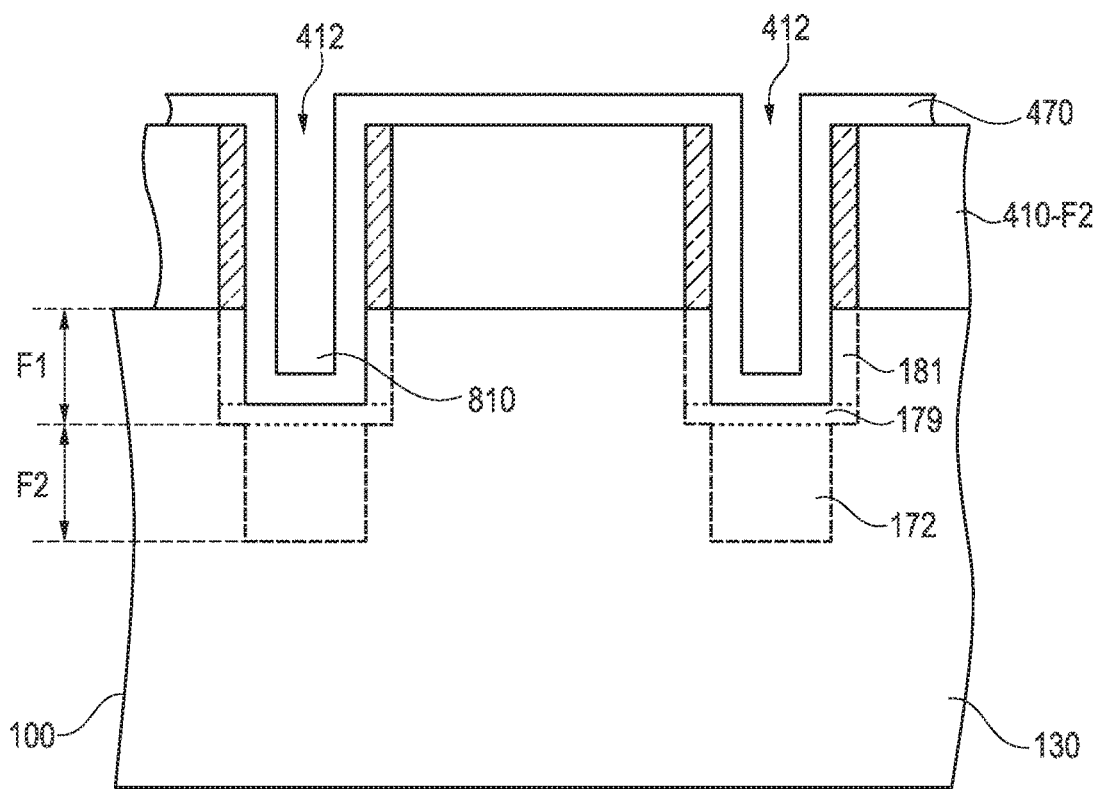
Figure 3H:
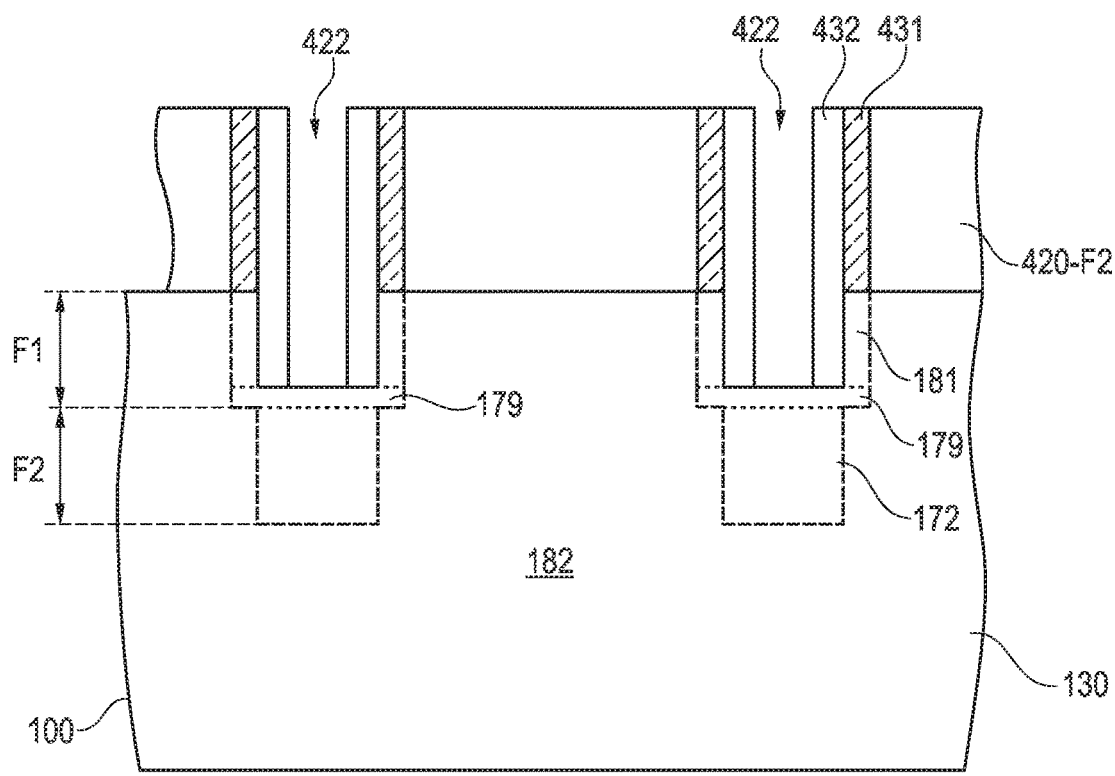
Figure 3I:
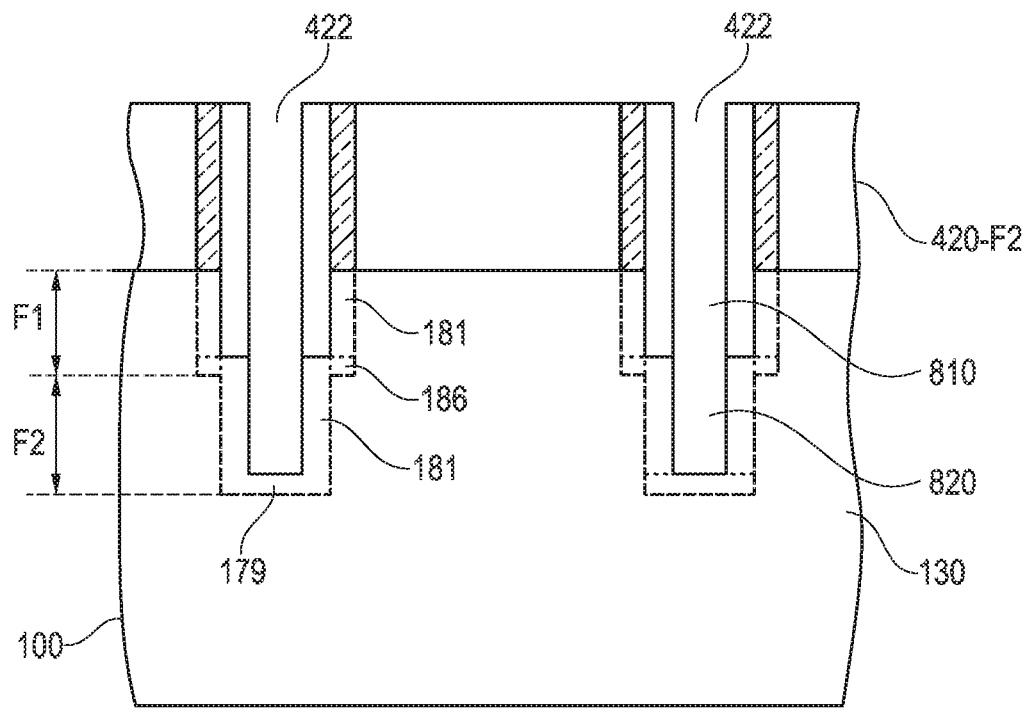
Figure 3J:
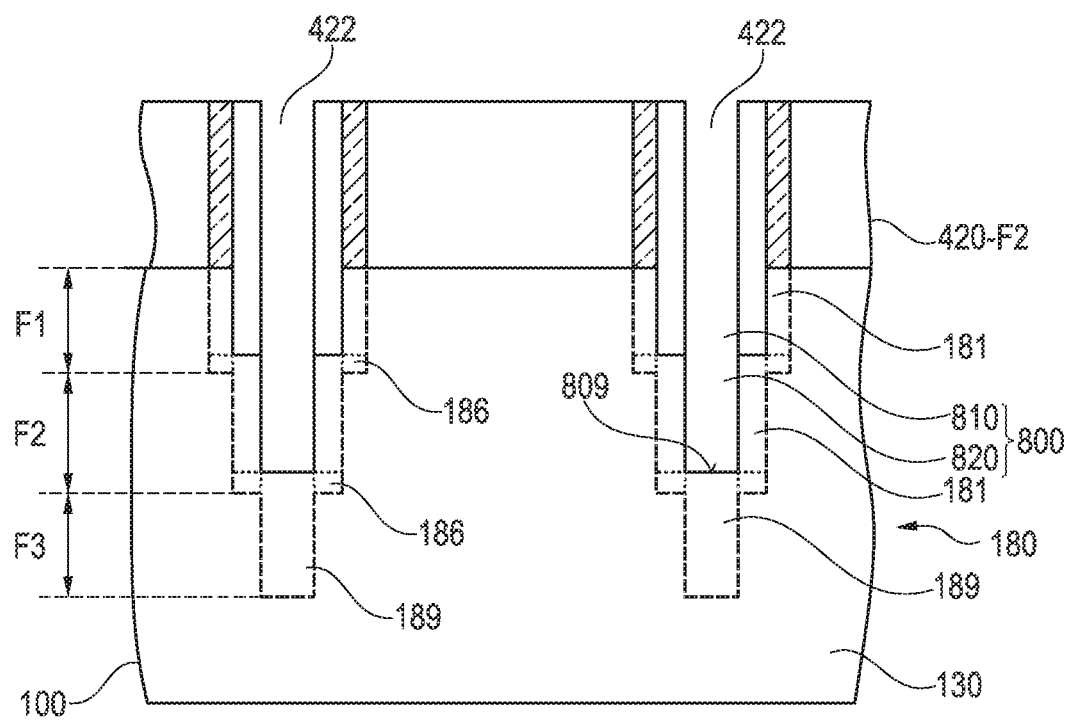
Figure 3K:
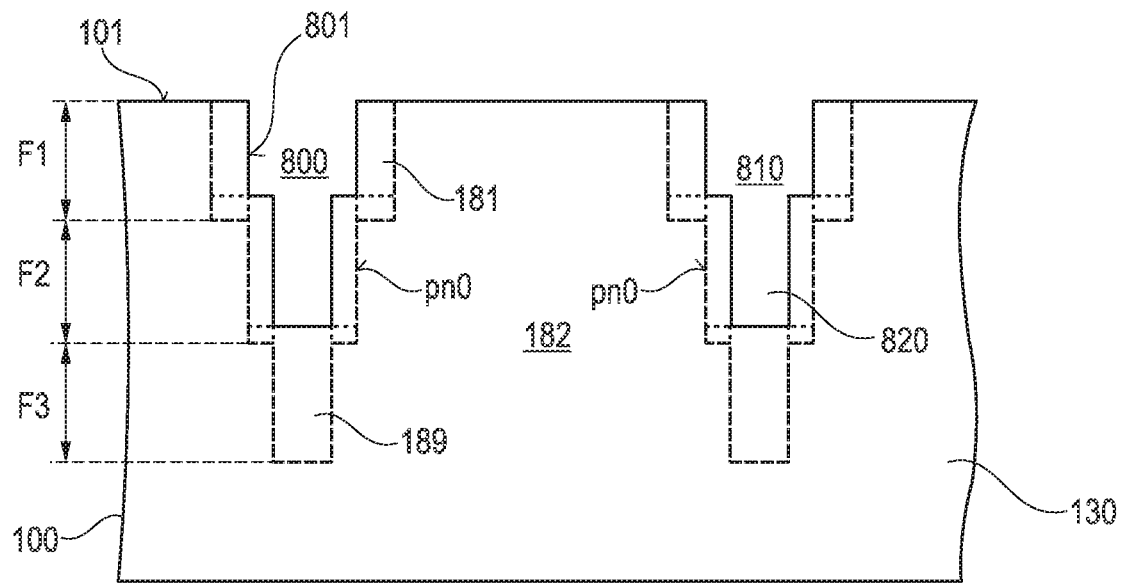
Figure 3L:
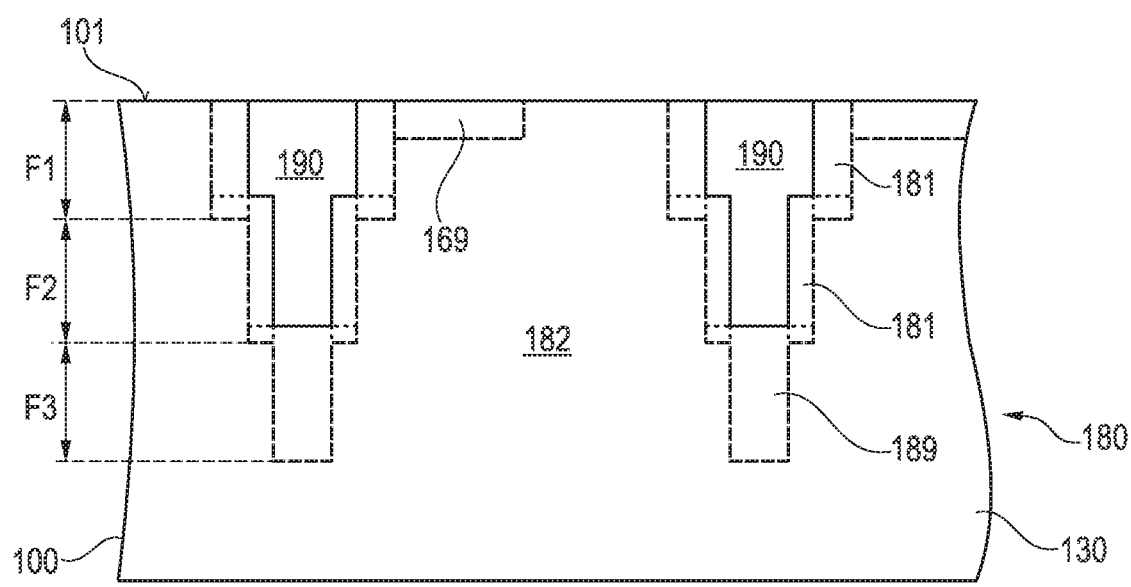
Figure 3M:
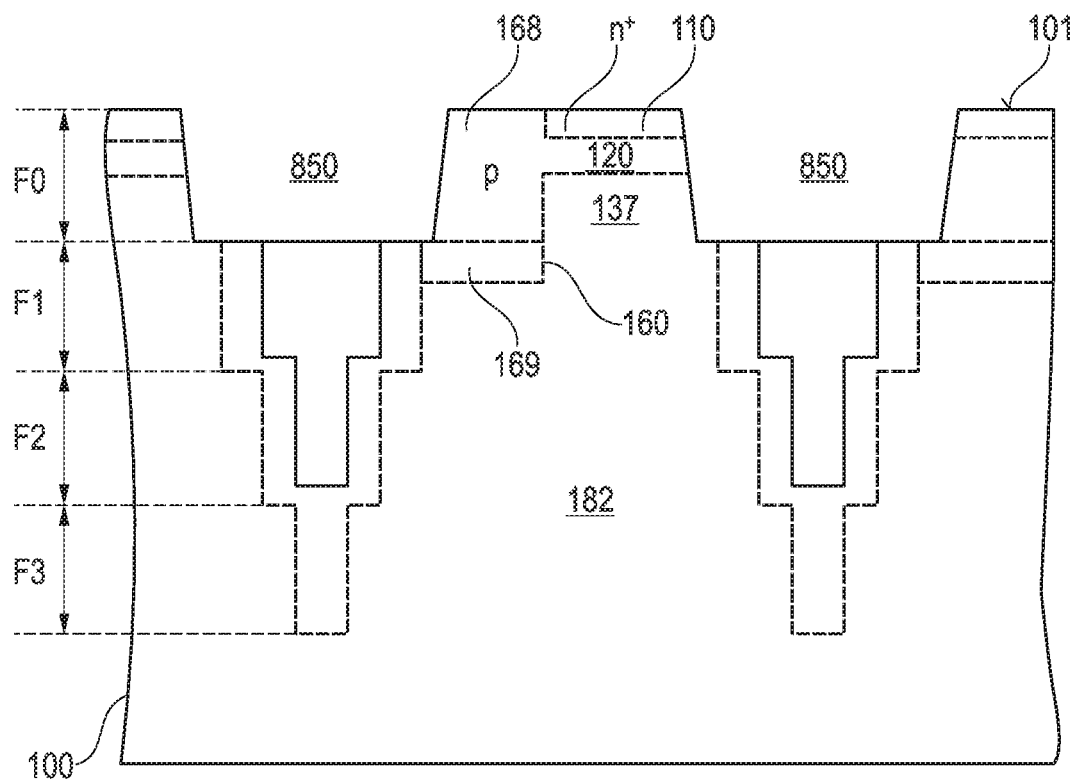
Figure 3N:
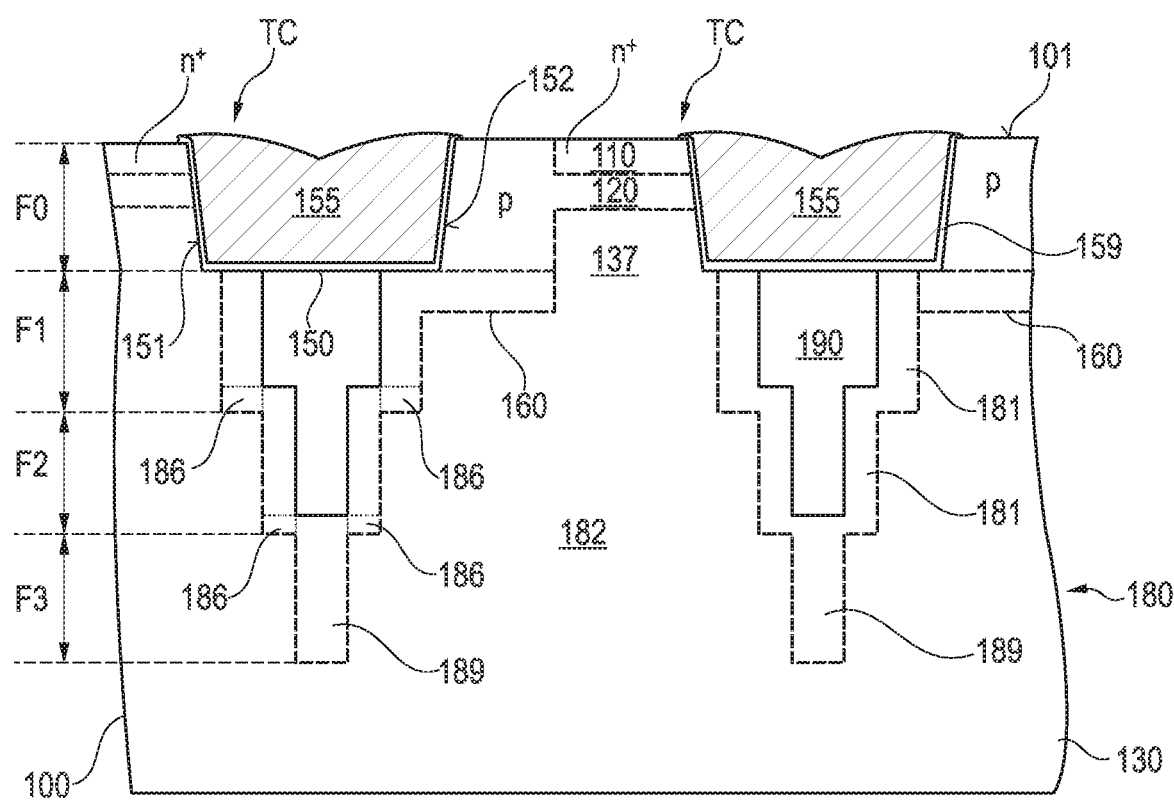

FIGS. 3A-3N illustrate a method using trenches 800 with stepped trench sidewalls 801 for forming a compensation structure 800, wherein trench sections in different floors of a silicon carbide body may have different mean widths.

The silicon carbide body 100 includes a main layer 130 of a first conductivity type. A process mask layer is deposited on the first surface 101 of the silicon carbide body 100. A photoresist layer is deposited on a top surface of the process mask layer. A photolithography process forms a photoresist mask 490 from the photoresist layer. The pattern of the photoresist mask 490 is transferred into the process mask layer, wherein a first process mask 410 with larger openings 411 is formed.

FIG. 3A shows the larger openings 411 exposing first surface sections of the first surface 101 of the silicon carbide body 100. The first process mask 410 is sufficiently thick to locally block deep vertical implantations of dopants into the silicon carbide body 100. For example, the first process mask 410 may include silicon oxide or a metal, e.g. tungsten (W). The first process mask 410 may have a sufficient thickness to mask implants of aluminum ions, nitrogen ions and/or boron ions with implant energy up to 25 MeV. For example, the thickness of the process mask 410 may be in a range from 0.3 µm to 37 µm, from 0.5 µm to 12 µm or from 1 µm to 4 µm.

The photoresist mask 490 may be removed. Dopants are implanted through the larger openings 411 into a first floor F1 of the silicon carbide body 100. The implantation beam may be modified and/or controlled in way such that the vertical range of the implanted dopants shows an approximately uniform distribution within the first floor F1.

According to FIG. 3B the implanted first dopants form first auxiliary regions 171 in the vertical projection of the larger openings 411 in the first floor F1. A vertical extension of the first floor F1 may be in a range from 0.2 µm to 20 µm, e.g. from 0.5 µm to 7 µm or from 1 µm to 3 µm, by way of example. Within the first auxiliary regions 171 the vertical dopant distribution may be approximately uniform.

A first auxiliary layer 460 may be formed at the front side of the silicon carbide body 100. The first auxiliary layer 460 may cover lateral and vertical surfaces at approximately uniform thickness.

FIG. 3C shows the first auxiliary layer 460 covering a top surface of the first process mask 410, lining sidewalls of the larger openings 411 of FIG. 3B and covering the first surface sections. A thickness of the first auxiliary layer 460 is smaller than 50% or even smaller than 25% of the smallest width of the larger openings 411. The first auxiliary layer 460 may be or may include a silicon oxide layer, by way of example.

Lateral portions of the first auxiliary layer 460 are removed. For example, anisotropic etching like reactive ion beam etching may selectively remove the lateral portions of the first auxiliary layer 460.

As illustrated in FIG. 3D, residuals of the first auxiliary layer 460 of FIG. 3C form first spacers 431 along inner sidewalls of the larger openings 411. The first spacers 431 and the first process mask 410 of FIG. 3B form a second process mask 420. The second process mask 420 includes smaller openings 421 that expose central sections of the first auxiliary regions 171. The second process mask 420 with the smaller openings 421 is used as etch mask for forming trenches. For example, the second process mask 420 masks reactive ion beam etching.

FIG. 3E shows first trench sections 810 extending from the first surface 101 into the first auxiliary regions 171. Residuals of the first auxiliary regions 171 of FIG. 3D at both lateral sides of the first trench sections 810 form compensation layer portions 181. A vertical extension of the compensation layer portions 181 may be equal to or deeper than a vertical extension of the first trench sections 810. In particular, the vertical extension of the compensation layer portions 181 is equal to the vertical extension of the first trench sections 810.

The vertical extension of the first trench sections 810 may be equal to or shallower than a vertical extension of the first auxiliary region 171. In the illustrated embodiment, the vertical extension of the first trench sections 810 is smaller than the vertical extension of the first floor F1. Residuals of the first auxiliary regions below the first trench sections 810 and below the compensation layer portions 181 form bottom layers 179.

The second process mask 420 may mask a further implant of first dopants, e.g. p-type dopants like aluminum atoms, into a second floor F2 of the silicon carbide body 100. In other words, the second process mask 420 for the first floor F1 may be used as first process mask 410-F2 with larger openings 412 for masking ion implantation of further first dopants into the second floor F2.

FIG. 3F shows second auxiliary regions 172 extending from a lower edge of the bottom layer 179 into the silicon carbide body 100. A lateral extension of the second auxiliary regions 172 may be equal to or smaller than a lateral extension of the first trench sections 810. In some embodiments, lateral straggling may result in second auxiliary regions 172 with a lateral extension that is larger than a lateral extension of the first trench sections 810.

A vertical distribution of the first dopants in the second floor F2 may be approximately uniform. A mean dopant concentration in the second auxiliary regions 172 may be equal to a mean dopant concentration in the first compensation layer portions 181 in the first floor F1 or may deviate from a mean dopant concentration in the compensation layer portions 181. The second floor F2 may have the same vertical extension or approximately the same vertical extension as the first floor F1. Alternatively, the vertical extension of the second floor F2 may deviate significantly from the vertical extension of the first floor F1, wherein the vertical extension of the second floor F2 may be greater or may be smaller than the vertical extension of the first floor F1. A second auxiliary layer 470 may be deposited on the front side of the silicon carbide body 100.

FIG. 3G shows the second auxiliary layer 470 covering at uniform thickness a top surface of the first process mask 410-F2 with larger openings 412 for masking ion implantation into the second floor F2, the sidewalls of the larger openings 412, the sidewalls of the first trench sections 810, and the bottom of the first trench section 810. An anisotropic etch may selectively remove the lateral portions of the second auxiliary layer 470. Residuals of the second auxiliary layer 470 form further spacers 432.

As illustrated in FIG. 3H, the first process mask 410-F2 of FIG. 3G and the spacers 431, 432 form a second process mask 420-F2 with smaller openings 422 for masking a trench etching into the second floor F2. The further spacers 432 line the sidewalls of the smaller openings 421 in the first process mask 410-F2 of FIG. 3F and the sidewalls of the first trench sections 810. The second process mask 420-F2 masks a further anisotropic etching that forms second trench sections 820.

FIG. 3I shows the second trench sections 820 extending from the bottom of the first trench sections 810 into the second floor F2. The second trench sections 820 may reach down to the bottom of the second floor F2 or may not reach the bottom of the second floor F2. Residuals of the second auxiliary regions 172 of FIG. 3H at opposite sides of each second trench section 820 form further compensation layer portions 181. Below the compensation layer portions 181 residuals of the bottom layers 179 shown in FIG. 3H form compensation connection regions 186 vertically below the compensation layer portions 181 in the first floor F1. Each connection region 186 is in direct contact with a vertically neighboring compensation layer portion 181 and with a laterally neighboring compensation layer portion 181.

Residuals of the second auxiliary regions 172 below the second trench sections 820 and below the compensation layer portions 181 in the second floor F2 form further bottom layers 179. Further first dopants may be implanted through the smaller openings 422 of the second process mask 420-F2.

As illustrated in FIG. 3J, the further first dopants form compensation bottom regions 189 in the third floor F3. The first and the second trench sections 810, 820 form a trench 800 with stepped trench sidewalls 801. The compensation bottom regions 189 extend from the trench bottom 809 of the trenches 800 into the third floor F3. Below the compensation layer portions 181 in the second floor F2, residuals of the bottom layers 179 of FIG. 3I form further compensation connection regions 186. The further compensation connection regions 186 connect the compensation bottom portion 189 with two compensation layer portions 181 formed at opposite sidewalls of the second trench section 820. The second process mask 420-F2 may be removed.

According to FIG. 3K, compensation layer portions 181 formed along opposite sidewalls of the same trench 800 and a compensation bottom portion 189 formed below the trench 800 are interconnected with each other and form first columns, e.g. p-type columns, of a compensation structure 180. Sections of the main layer 130 between neighboring first columns form compensation regions 182. The compensation regions 182 form second columns, e.g. n-type columns, of a compensation structure 180. The n-type columns and the p-type columns form a regular pattern of vertical pn junctions with steps.

The trenches 800 may be filled with a suitable material. Masked implantations may form further doped regions in the first floor F1.

FIG. 3L shows fill structures 190 filling the trenches 800 of FIG. 3K. The fill structures 190 may include one or more dielectric materials. For example, the fills structures 190 may include exclusively silicon oxide or silicon oxide in combination with at least one further material. The further materials may include silicon nitride, doped semiconductor material, and/or intrinsic semiconductor material.

A mean dopant concentration in each of the first floor F1, the second floor F2 and the third floor F3 may be selected in a way that in each of the floors F1, F2, F3 substantially charge compensation with the compensation layer portions 181 is given. Since absolute compensation may not be accomplished due to process scattering or other reasons, one or more of the floors may be deliberately differ from exact charge compensation. As an example, doping in first floor F1 may be selected in order to not fully compensate charge of layer portion 181 in first floor F1; doping in second floor F2 may be selected to substantially compensate charge of layer portion 181 in second floor F2 and doping in third floor F3 may be selected to over-compensate charge of layer portion 181 in third floor F3. Of course, the inverse scheme of doping or another scheme of doping may be chosen.

For the case of filling the trenches with doped semiconductor material, this doping level can be taken into account when choosing the doping parameter of the compensation layers and/or choosing the doping levels of first, second and third floors F1, F2, F3, respectively, to obtain the desired degree of charge balance. Deep shielding portions 169 of the conductivity type of the compensation layer portions 181 may be formed along the first surface 101. Each deep shielding portion 169 may form a direct vertical contact with one single compensation layer portion 181 or may overlap with one single compensation layer portion 181.

A top layer F0 may be formed by epitaxy on the first floor F1, may be formed by an upper portion of the first floor F1 or may be provided between the first surface 101 and the first floor prior to forming the trenches 800. Masked ion implantations into the top layer F0 may form doped regions of transistor cells. Gate trenches 850 may be formed in the top layer F0.

FIG. 3M shows the gate trenches 850. The gate trenches 850 extend through the top layer F0 and expose the fill structures 190 and top surfaces of the compensation layer portions 181 in the first floor F1. The gate trenches 850 may be stripe-shaped. A lateral longitudinal axis of the gate trenches 850 may extend parallel to a lateral longitudinal axis of the fill structures 190. According to another embodiment, the lateral longitudinal axis of the gate trenches 850 may extend tilted, e.g. orthogonal, to a lateral longitudinal axis of the fill structures 190. The doped regions in the top layer F0 may include top shielding portions 168, source regions 110, body regions 120, and current spread regions 137.

A gate dielectric 159 may be formed that lines at least one of the sidewalls of each gate trench 850. Forming the gate dielectric 159 may include thermal oxidation of exposed silicon carbide and/or deposition of one or more dielectric materials. One or more conductive materials may be deposited into the gate trenches 850.

FIG. 3N shows transistor cells TC formed in the top layer F0. Each transistor cell TC includes a gate structure 150 formed in one of the gate trenches 850 of FIG. 3M. The gate structures 150 include a conductive gate electrode 155 and a gate dielectric 159. The gate dielectric 159 is formed between the gate electrode 155 and the silicon carbide body 100 at least along an active first gate sidewall 151 of the gate structure 150.

Each transistor cell TC includes a body region 120 of the second conductivity type. The body region 120 is in direct contact with the active first gate sidewall 151. A source region 110 is formed between the first surface 101 and the body region 120. A current spread region 137 may be formed between the body region 120 and a neighboring compensation region 182. The current spread region 137 and the neighboring compensation region 182 may form a unipolar junction or may have the same mean net dopant concentration. The source region 110 and the current spread region 137 have the first conductivity type. The body region 120 forms a first pn junction with the current spread region 137 and a second pn junction with the source region 110.

A shielding region 160 may include a top shielding portion 168 and the deep shielding portion 169 of FIG. 3L. The shielding region 160 extends along an inactive second gate sidewall 152 of the gate structure 150. Each shielding region 160 is in direct contact with a compensation layer portion 181.

FIGS. 4A-4D illustrate a method for at least partially compensating excess dopants. For example, the compensation connection regions 186 of FIG. 3N may provide a local excess of dopants. A local excess of dopants typically results in a significant drop of the degree of charge balance.

Figure 4A:
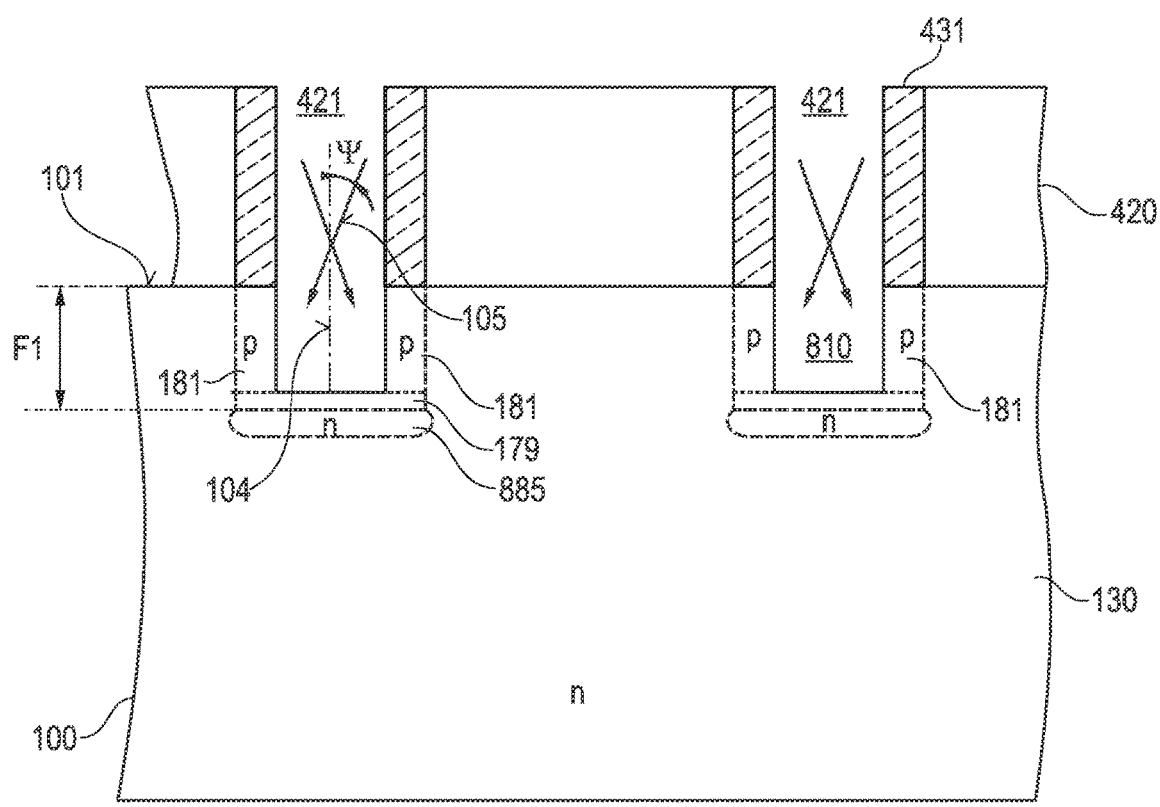
FIGS. 4A-4D show simplified vertical cross-sectional views of a portion of a silicon carbide body according to an embodiment providing compensation adjustment regions.

In FIG. 4A a vertical extension of the first trench section 810 is smaller than the vertical extension of the first floor F1. Bottom layers 179 are formed as described with reference to FIG. 3E. Auxiliary dopants of the first conductivity type may be implanted into a section of the silicon carbide body 100 directly below and/or into the bottom layers 179. Implanting the auxiliary dopants may include a tilted implantation, wherein implant angles 4 between a vertical direction 104 and the ion beam 105 may be in a range from 5° to 20° and from −5° to −20°.

The implanted auxiliary dopants form intermediate layers 885 below the first trench sections 810. The intermediate layers 885 may be n doped layers formed below p doped bottom layers 179. The intermediate layers 885 and the bottom layers 179 may partly overlap, wherein in the overlapping portion the intermediate layer 885 may partly compensate the doping in the bottom layer 179. A lateral width of the intermediate layer 885 may be greater than a lateral width of the first trench section 810 such that the intermediate layer 885 includes sections directly below the compensation layer portions 181 in the first floor F1.

Further first dopants are implanted at comparatively high mean energy through the bottom of the first trench sections 810 to form second auxiliary regions 172 as described with reference to FIG. 3E and FIG. 3F.

Figure 4B:
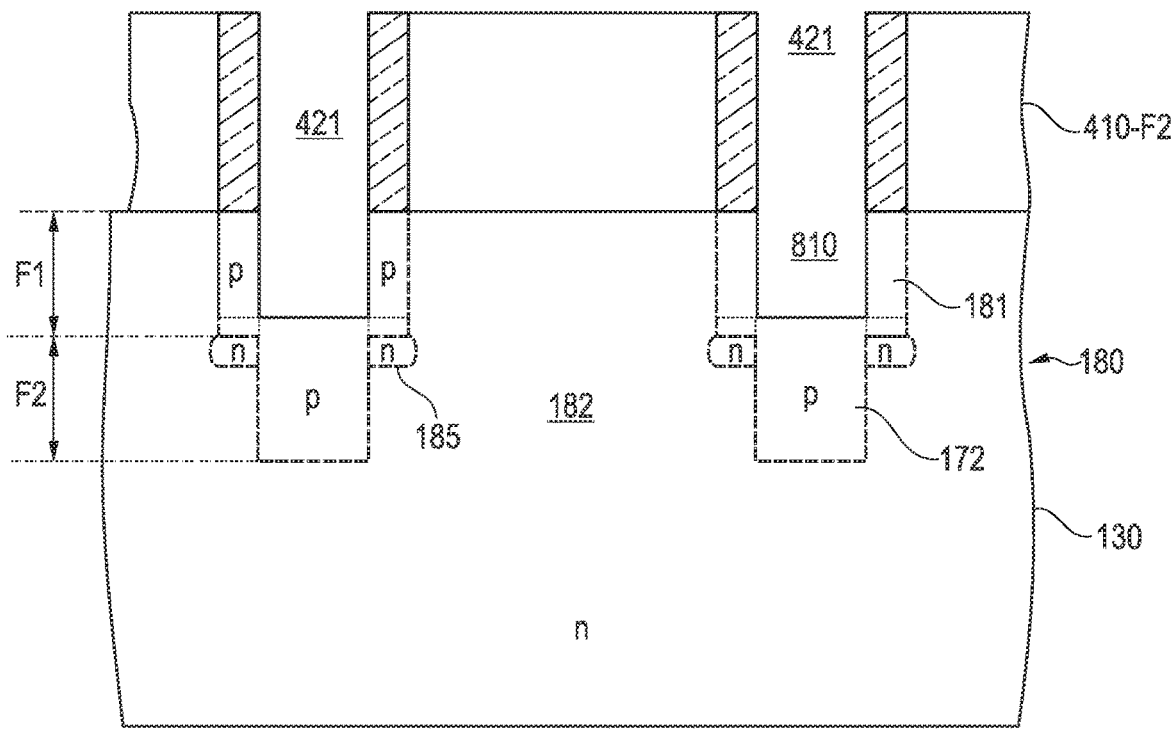

FIG. 4B shows the second auxiliary regions 172 as described with reference to FIG. 3F. Residuals of the intermediate layer 885 of FIG. 4A form compensation adjustment regions 185 at both sides of each second auxiliary region 172.

A second trench section 820 may be formed as described with reference to FIG. 3H and FIG. 3I, wherein a further bottom layer 179 and a further intermediate layer 885 may be formed as described with reference to FIG. 4A.

Figure 4C:
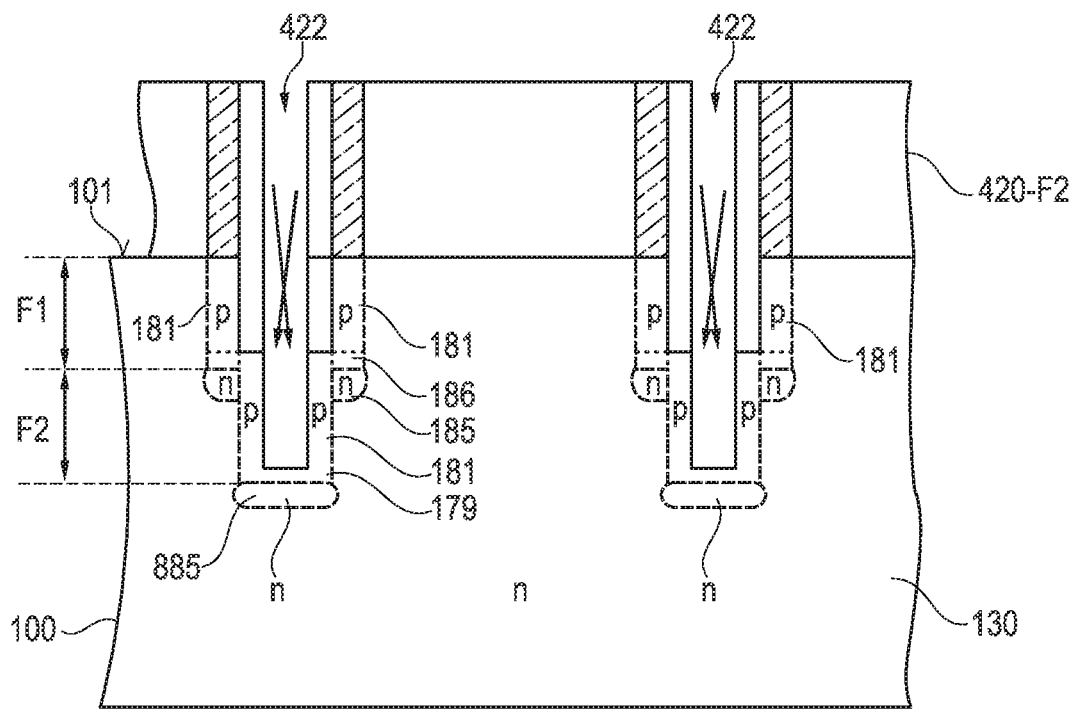

As illustrated in FIG. 4C, the compensation adjustment regions 185 in the second floor F2 may be formed directly below the compensation connection regions 186 in the first floor F1 and in lateral contact with the compensation connection regions 186 in the second floor F2. Compensation bottom regions 189 may be formed as described with reference to FIG. 3J.

Figure 4D:
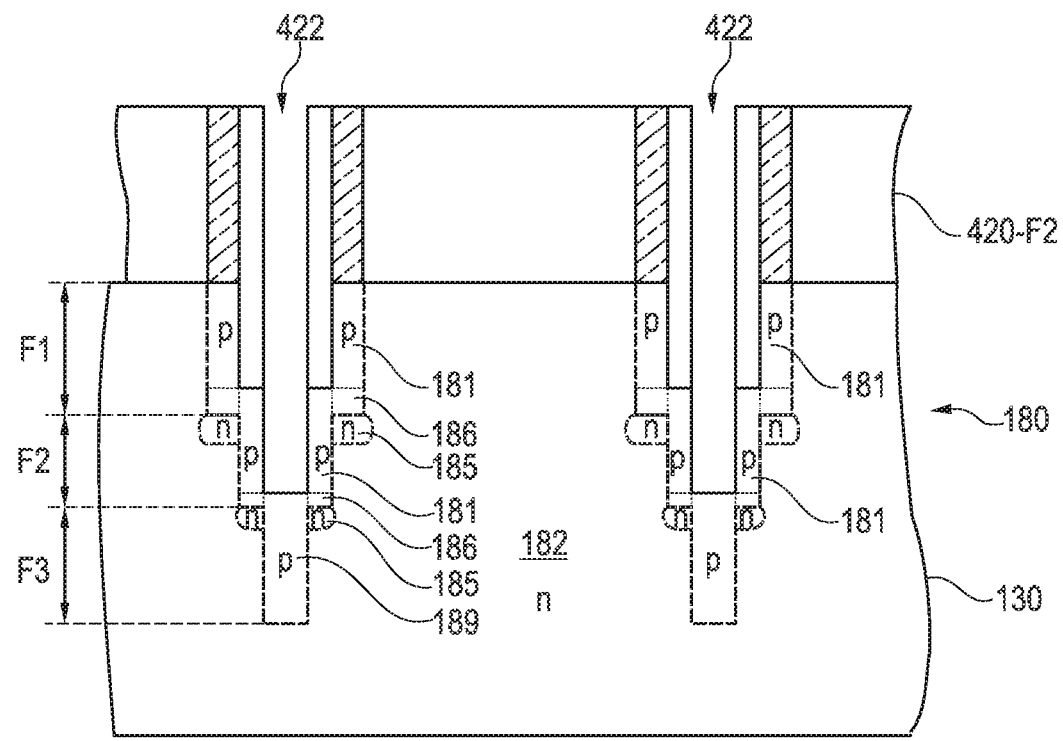

According to FIG. 4D, residuals of the intermediate layer 885 in the third floor F3 may form compensation adjustment regions 185 on opposite sides of each compensation bottom region 189. The compensation adjustment regions 185 in the third floor F3 may be formed directly below the compensation connection regions 186 in the second floor F2 and in lateral contact with the compensation bottom region 189.

Figure 5A:
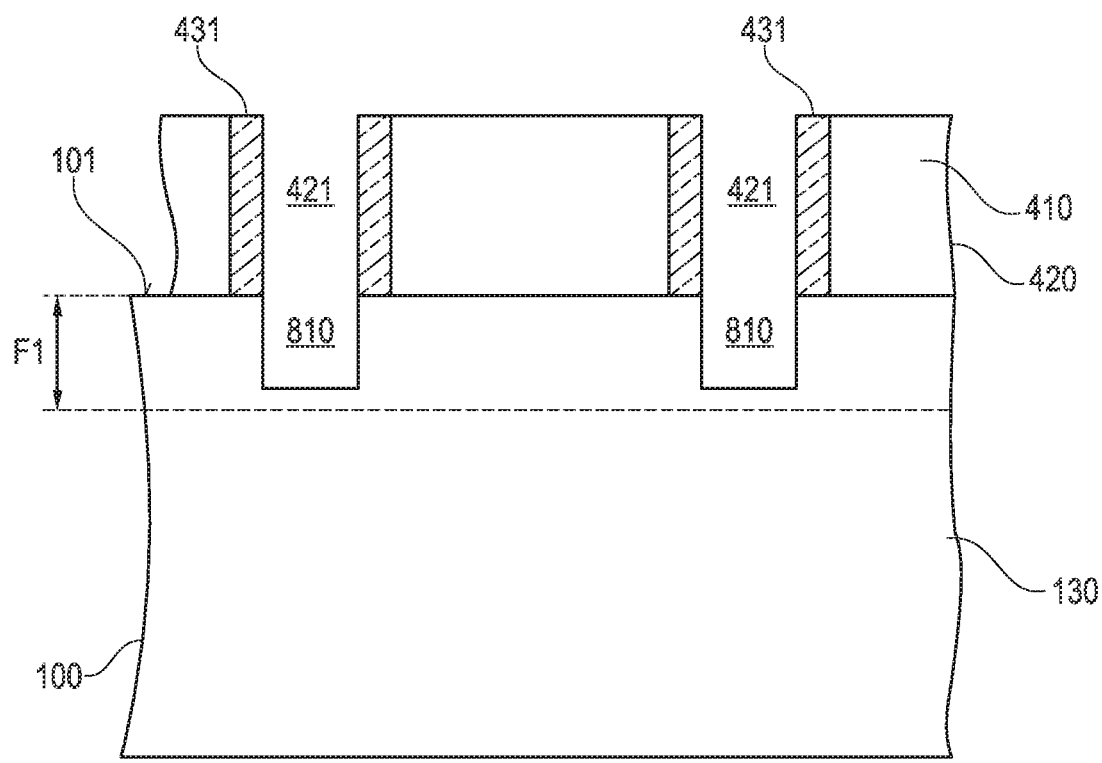
FIGS. 5A-5C show simplified vertical cross-sectional views of a portion of a silicon carbide body for illustrating a method of forming a silicon carbide device according to an embodiment including ion implantation after forming a trench with stepped trench sidewalls.
Figure 5B:
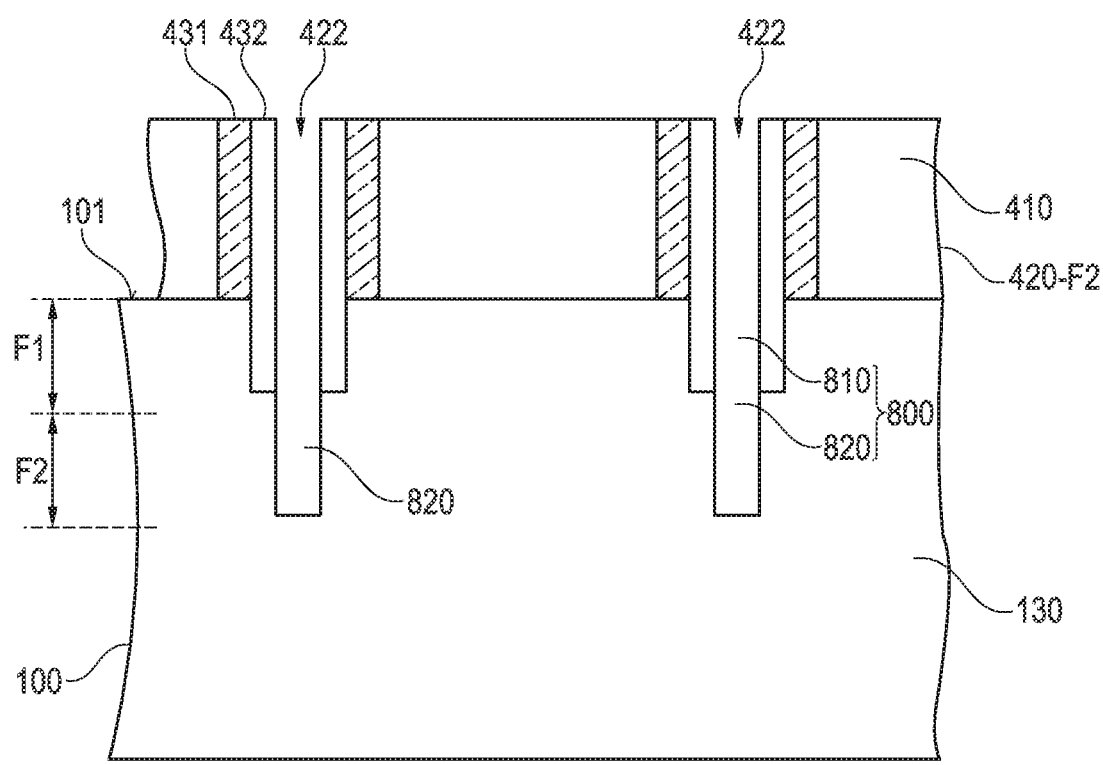
Figure 5C:
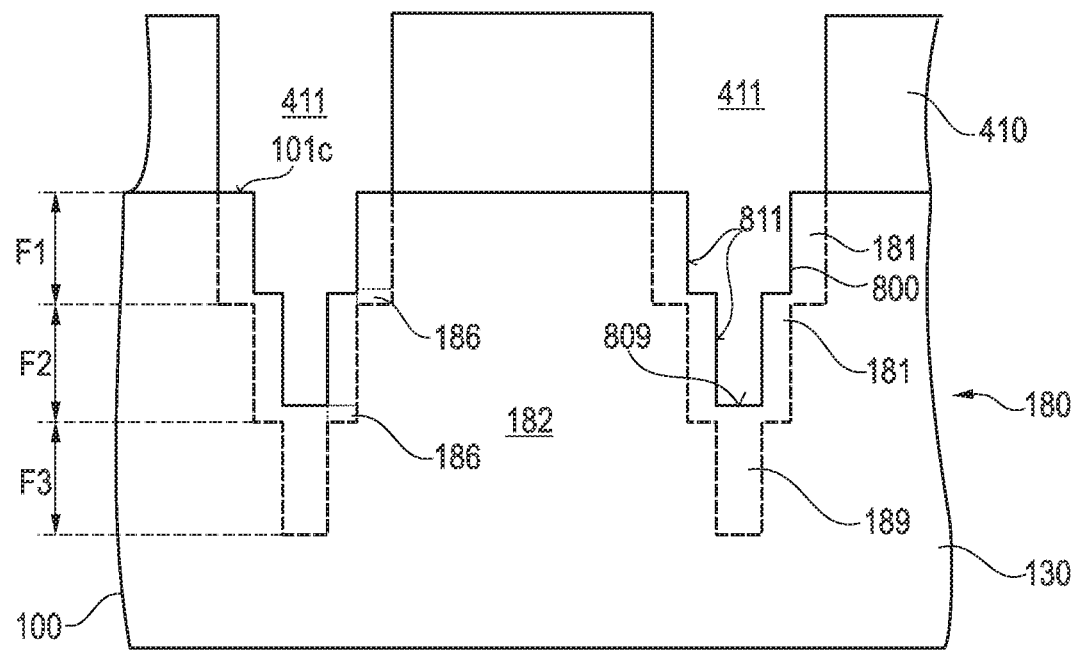
Figure 5D:
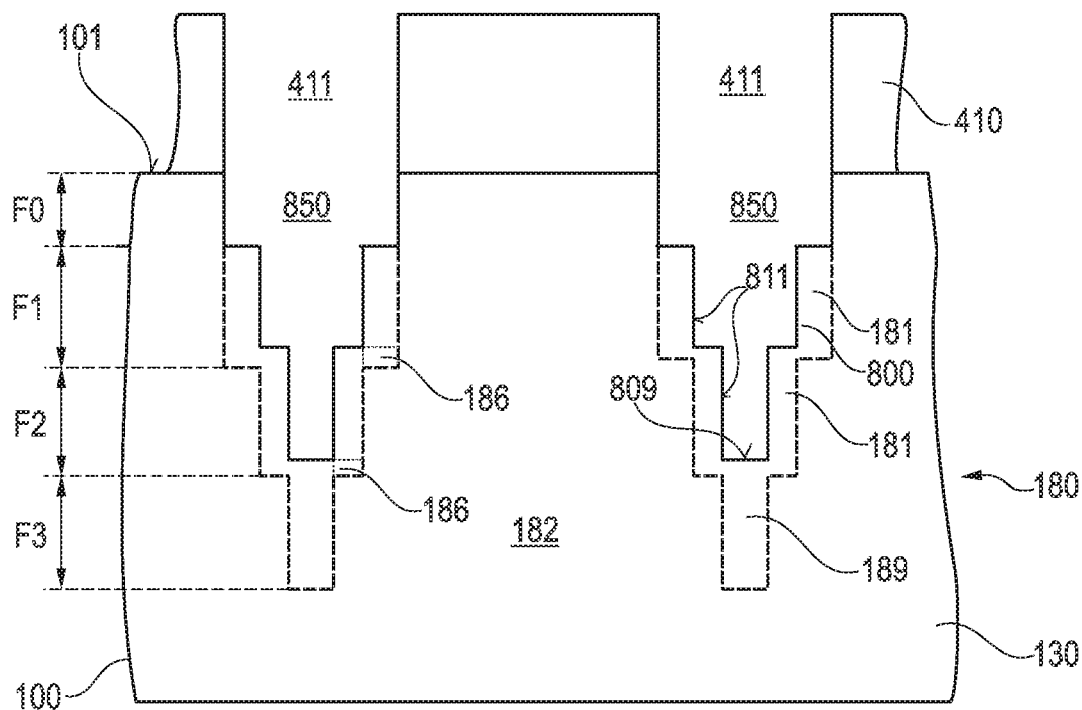
FIG. 5D show a simplified vertical cross-sectional view of a portion of a silicon carbide body for illustrating a method of forming a silicon carbide device according to an embodiment providing self-aligned gate trenches.

In the method illustrated in FIGS. 5A to 5C and in the method according to FIG. 5D one single implant forms all compensation layer portions 181 and the bottom compensation region 189.

FIG. 5A shows a second process mask 420 with a smaller opening 421. A first trench section 810 is formed in the vertical projection of the smaller opening 421. The first trench section 810 may extend from the first surface 101 into a first floor F1 of the silicon carbide body 100. According to an embodiment, the second process mask 420 may include a first process mask 410 and a spacer 431 lining a larger opening in the first process mask 410.

A further spacer 432 is formed that lines the inner sidewall of the smaller opening 421 and the inner sidewall of the first trench section 810. The second process mask 420 and the further spacer 432 form a further second process mask 420-F2 with smaller openings 422, which may mask a further etching into the silicon carbide body 100. A second trench section 820 is formed in an exposed section of the trench bottom of the first trench section 810.

As illustrated in FIG. 5B, the second trench section 820 may extend from the trench bottom of the first trench section 810 into a second floor F2 of the silicon carbide body 100. The first trench section 810 and the second trench section 820 form a trench 800.

A first process mask 410 with larger openings 411 is formed, wherein the larger openings 411 expose the trenches 800 and collar surface sections 101c of the first surface 101 around the openings of the trenches 800. For example, the spacers 432, 431 may be selectively removed to lay open and recover the first process mask 410.

First dopants are implanted through the larger openings 411, wherein the implant beam is controlled and/or modified to obtain an approximately uniform distribution of the implanted first dopants along the vertical direction, e.g. over at least 50% or even at least 70% or even at least 80% of the vertical extension of each implant region.

According to FIG. 5C the implanted first dopants form compensation layer portions 181 and compensation bottom regions 189 in one single implantation process using one single implantation mask.

The compensation layer portions 181 may be formed along all steep sidewall sections 811 of the trenches 800. The maximum implant depth and the vertical extension of the trench sections 810, 820 may be equal. In an alternative, the maximum implant depth may be smaller than the vertical extension of the trench sections 810, 820. In both cases, a further, tilted implant may form compensation connection regions as described with reference to FIGS. 6A-6B. In the illustrated alternative, the maximum implant depth is greater than the vertical extension of the trench sections 810, 820. The implant forms compensation connection regions 186 directly below each compensation layer portion 181.

The compensation bottom regions 189 extend from the bottom surface 809 of the trenches 800 into the third floor F3. Compensation adjustment regions may be formed as described with reference to FIGS. 6A to 6B. A top layer may be formed on the first floor F1, e.g. by epitaxy, and gate electrodes may be formed in the top layer as described with respect to FIG. 3N, by way of example.

FIG. 5D refers to a method with a silicon carbide body 100 including a top layer F0 between the first floor F1 and the first surface 101 prior to forming the trenches 800. A process mask 410 as described in FIGS. 5A-5C may be formed on the top layer F0 and is used to form gate trenches 850 in the top layer F0. After forming the gate trenches 850, the first and second trench sections 810, 820 are formed at the bottom of the gate trenches 850 in the first and second floors F1, F2.

FIG. 5D shows that the final implant mask (first process mask 410), which is used for forming the compensation layer portions 181 and the compensation bottom regions 189, may be identical with the gate trench etch mask or may be obtained from the gate trench etch mask by modifying the gate trench etch mask. Modifying the gate trench etch mask may include spacer formation or wet etching, by way of example. Forming the gate trenches 850 in the top layer F0 may also be combined with the multiple implant/etch sequence described with reference to FIGS. 3A-3N.

Figure 6A:
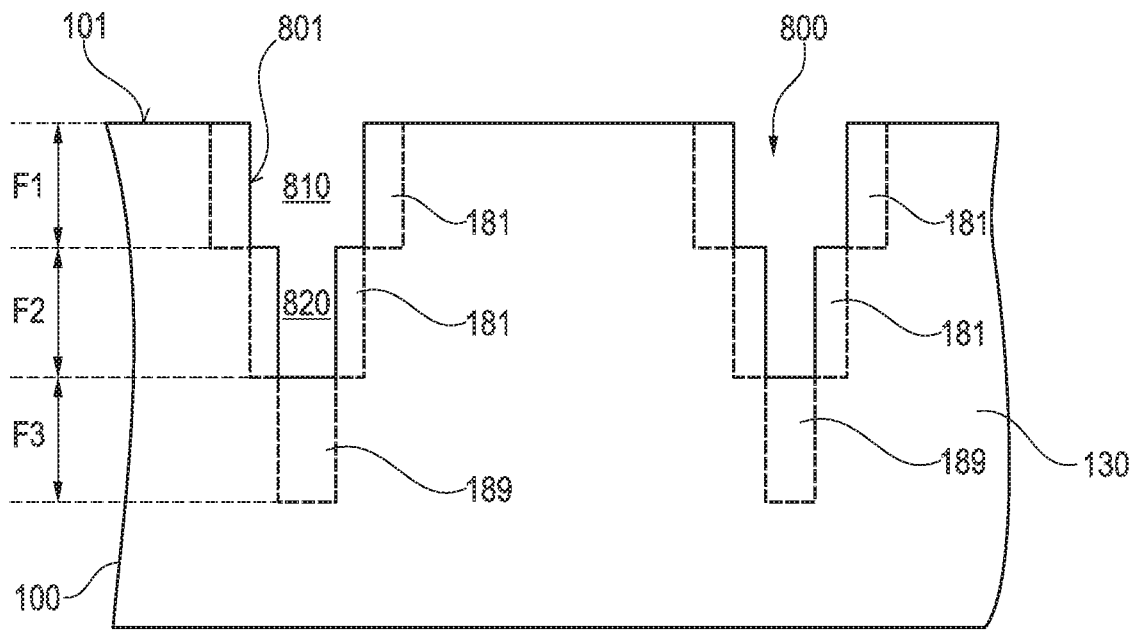
FIGS. 6A-6B show simplified vertical cross-sectional views of a portion of a silicon carbide body according to an embodiment providing compensation connection regions.
Figure 6B:
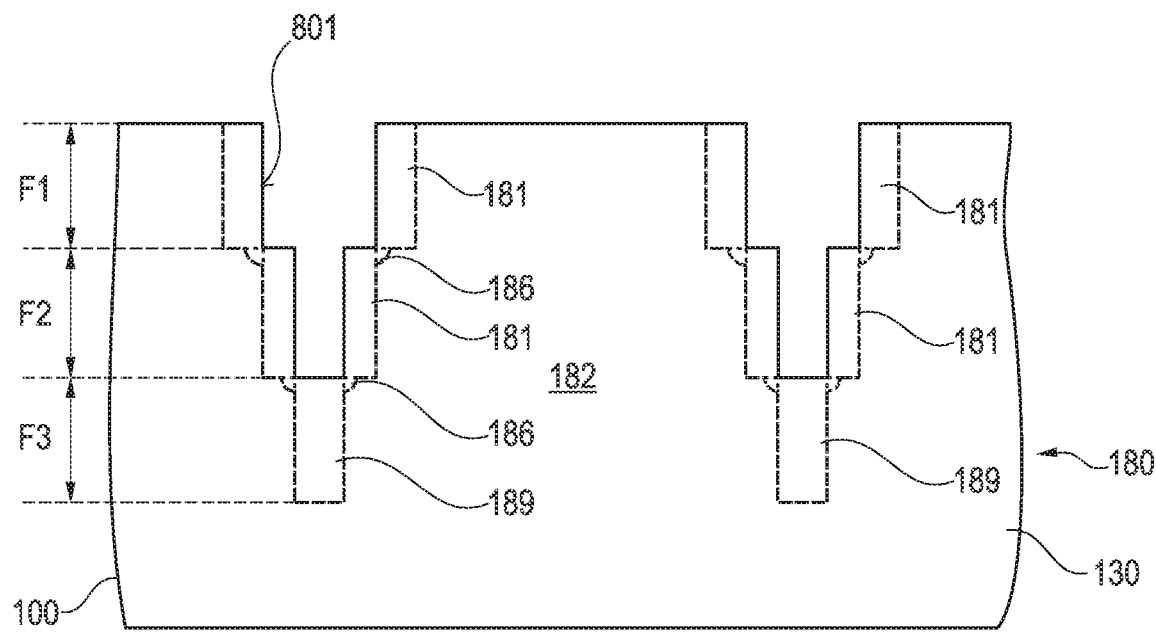

FIGS. 6A and 6B refer to a method that connects vertically neighboring compensation layer portions 181 at a process stage after forming a trench 800 with at least two trench sections 810, 820.

According to FIG. 6A the vertical extension of the first trench sections 810 and the vertical extension of the first floor F1 are equal. The vertical extension of the second trench sections 820 and the vertical extension of the second floor F2 are equal. Vertically neighboring compensation layer portions 181 may be disconnected from each other.

At least two symmetric, tilted implantations may implant supplementary dopants of the conductivity type of the compensation layer portions 181 into the trench sidewalls 801. Implant angles φ between a vertical direction and the ion beam may be in a range from 5° to 20° and from −5° to −20°.

As illustrated in FIG. 6B the implanted supplementary dopants form compensation connection regions along the edges of the stepped trench sidewalls 801 and along the edges between the trench sidewalls 801 and the trench bottom 809. The compensation connection regions 186 connect the compensation bottom portions 189 and the compensation layer portions 181 formed along the same trench 800.

Figure 7:
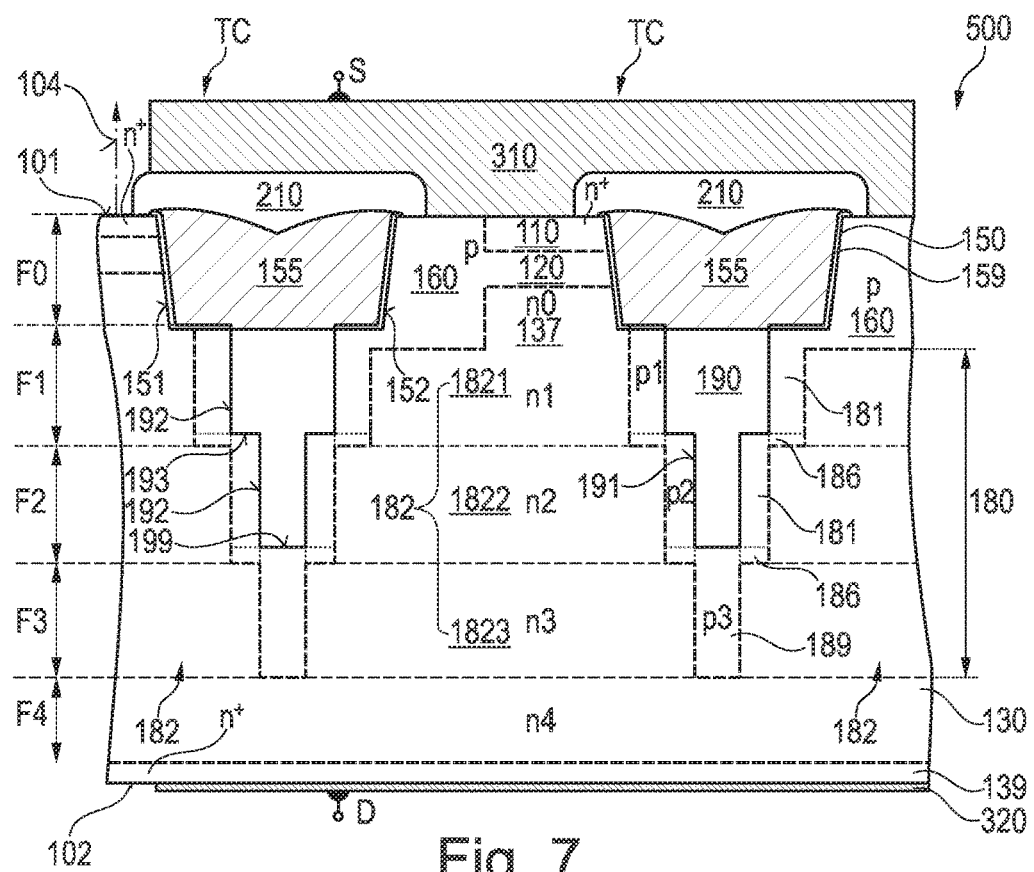
FIGS. 7-9 illustrate schematic vertical cross-sectional views of portions of silicon carbide devices with compensation structures including laterally shifted steep compensation layer portions according to embodiments concerning transistor cells with trench gate structures and one-sided channels.

FIG. 7 shows a silicon carbide device 500 including transistor cells TC and a compensation structure 180. The silicon carbide device 500 includes a silicon carbide body 100 that may be processed as described above in connection with FIGS. 1A-1B, FIGS. 2A-2B, FIGS. 3A-3N, FIGS. 4A-4B, FIGS. 5A-5C and FIGS. 6A-6B.

A first surface 101 at a front side and a second surface 102 at a rear side of the silicon carbide body 100 run approximately parallel to each other. A thickness of the silicon carbide body 100 is given along a vertical direction 104. The vertical direction 104 may be parallel to a surface normal on a planar first surface 101 or to a surface normal of a mean plane of a ripped first surface 101. The first surface 101 may be tilted to a main crystal plane of the silicon carbide lattice. For example, the first surface 101 may be tilted to the (0001) plane of a silicon carbide body 100 with hexagonal crystal lattice by an off-axis angle of about 4 degree.

The transistor cells TC may be formed along trench gate structures 150 that extend from the first surface 101 into the silicon carbide body 100. The gate structures 150 may be stripe-shaped. That is to say: a length of the gate structures 150 along a lateral first direction is greater than a width of the gate structures 150 along a lateral second direction orthogonal to the first direction. The gate structures 150 may be long stripes extending along a lateral longitudinal direction through a central active region of the silicon carbide body 100. In other embodiments, lateral cross-sections of the gate structures 150 may be circles, ovals or regular polygons, e.g. squares or hexagons, with or without rounded or beveled corners.

The gate structures 150 include a conductive gate electrode 155 that may include or consist of a heavily doped polycrystalline silicon layer and/or a metal-containing layer. A gate dielectric 159 separates the gate electrode 155 from the silicon carbide body 100 along at least one side of the gate structure 150. The gate dielectric 159 may include or consist of thermally grown or deposited silicon oxide, silicon nitride, silicon oxynitride, another deposited dielectric material or any combination thereof. A thickness of the gate dielectric 159 may be selected to obtain transistor cells TC with a threshold voltage in a range from 1.0 V to 8 V. The gate structures 150 may exclusively include the gate electrode 155 and the gate dielectric 159 or may include further conductive and/or dielectric structures in addition to the gate electrode 155 and the gate dielectric 159.

The gate structures 150 may be equally spaced and/or may have equal width. A center-to-center distance between neighboring gate structures 150 may be in a range from 1 μm to 10 μm, e.g., from 2 μm to 5 μm. A length of the gate structures 150 may be up to several millimeters. A vertical extension of the gate structures 150 may be in a range from 0.3 μm to 5 μm, e.g., in a range from 0.5 μm to 2 μm. At the bottom, the gate structures 150 may be rounded.

Opposing first and second gate sidewalls 151, 152 of each of the gate structures 150 may run essentially along the vertical direction 104 or may be tilted with respect to the vertical direction 104 by a taper angle. In the latter case, the gate structures 150 may taper with increasing distance to the first surface 101. The taper angle between the gate sidewalls 151, 152 and the vertical direction 104 at the first surface 101 may be chosen according to the alignment of the crystal axes and/or according to the off-axis angle.

For example, the absolute value of the taper angle between the first gate sidewall 151 and the vertical direction 104 may deviate from the absolute value of the off-axis angle by not more than ±1° (e.g., in the case of 4H—SiC the taper angle may range from at least 3° to at most 5°). The taper angle may, however, deviate from the off-axis angle in orientation. The taper angle between the second gate sidewall 152, which is opposite to the first gate sidewall 151, and the vertical direction may be oriented opposite to the taper angle of the first sidewall 151. The larger the taper angle, the narrower the gate structure 150 becomes starting from the first surface 101.

In general, at least the first gate sidewall 151 may run essentially along a crystal plane of the silicon carbide body 100 in which charge carrier mobility is high (e.g., one of the {11-20} or the {1-100} crystal planes). The first gate sidewall 151 may be an active sidewall, that is to say, the channel region may run along the first gate sidewall 151. In some embodiments, the second gate sidewall 152 may also be an active sidewall (e.g., in the case of a vertical trench gate structure 150). In other embodiments, (e.g. in case of a tapering trench gate structure 150) the second gate sidewall 152 may be an inactive sidewall.

Doped regions in portions of the silicon carbide body 100 laterally between two neighboring gate structures 150 may include a source region 110, a body region 120, a current spread region 137 and a shielding region 160. The source region 110 and the current spread region 137 have a first conductivity type. The body region 120 and the shielding region 160 have the complementary second conductivity type. In the illustrated embodiment, the first conductivity type is n-type and the second conductivity type is p-type. In alternative embodiments, the first conductivity type may be p-type and the second conductivity type may be n-type.

The source region 110, the body region 120 and the current spread region 137 may be in direct contact with the first gate sidewall 151 of a first gate trench structure 150. The body region 120 separates the source region 110 and the current spread region 137. The source region 110 may be formed between the first surface 101 and the body region 120. The body region 120 and the source region 110 form a pn junction. The body region 120 and the current spread region 137 form a pn junction.

A vertical extension of the body region 120 corresponds to a channel length of the transistor cells TC and may be in a range from 0.2 μm to 1.5 μm. Along the lateral direction orthogonal to the cross-sectional plane, the source region 110 may extend without interruptions along the complete lateral length of the gate structure 150.

The shielding region 160 is formed between the body region 120 and the inactive second gate sidewall 152 of a neighboring second gate structure 150. The body region 120 and the shielding region 160 may form a unipolar junction. The shielding region 160 extends along the inactive second gate sidewall 152 of the second gate structure 150 from the first surface 101 into the silicon carbide body 100. A vertical extension of the shielding regions 160 is greater than a vertical extension of the gate structures 150.

A maximum dopant concentration in the shielding region 160 may be higher than a maximum dopant concentration in the body region 120. A vertical dopant concentration profile in the shielding region 160 may have a local maximum at a position below the trench gate structure 150. Along the inactive second gate sidewall 152 a dopant concentration in the shielding region 160 may be higher, i.e., at least ten times as high as a dopant concentration in the body region 120 along the active first gate sidewall 151. Along the lateral direction orthogonal to the cross-sectional plane, the shielding region 160 may extend without interruptions along the complete lateral length of the gate structure 150.

The compensation structure 180 may be formed in a main layer 130. The main layer 130 is formed between the gate structures 150 and the second surface 102. The main layer 130 may be a layer grown by epitaxy. The main layer 130 may be uniformly doped or may have a non-uniform vertical distribution of dopants. For example, the main layer 130 may include two or more vertically stacked floors F1, . . . , Fn with n greater 1. Each floor F1, F2, . . . may have a uniform dopant distribution or may have a non-uniform vertical dopant profile. The floors F1, F2, . . . may have the same vertical extension or at least one of the floors F1, F2, . . . may have a vertical extension different from at least one of the other floors F1, F2, . . . . A vertical extension of each floor F1, F2, . . . may be in a range from 0.5 µm to 7 µm, for example from 1 µm to 5 µm. The floors F1, F2 . . . may have the same mean dopant concentration or at least one of the floors F1, F2, . . . may have a mean dopant concentration different from at least one of the other floors F1, F2, . . . . For example, the mean dopant concentration in each floor F(n+1) may be lower than the mean dopant concentration in floor Fn.

A heavily doped contact portion or drain layer 139 may be formed between the main layer 130 and the second surface 102. The contact portion 139 may have the first conductivity type for a power MOSFET or a diode. For IGBTs the backside contact or backside emitter region may be p-doped. The contact portion 139 may be or may include a substrate portion obtained from a crystalline ingot and/or may include a heavily doped portion of a layer formed by epitaxy. Along the second surface 102, a dopant concentration in the contact portion 139 is sufficiently high to ensure a low-resistive ohmic contact between the contact portion 139 and a metal structure.

The main layer 130 may directly adjoin the contact portion 139. Alternatively, a spacer layer may separate the main layer 130 and the contact portion 139. The spacer layer may have the first conductivity type and may include a buffer layer. A vertical extension of the spacer layer may be between 0.5 µm and 50 µm or between 1 µm and 10 µm. A mean dopant concentration in the spacer layer may be in a range from $3*10^{17}$ cm$^{-3}$ to $10^{19}$ cm$^{-3}$, by way of example.

The compensation structure 180 in the main layer 130 may include a superjunction structure with first columns of the first conductivity type and with second columns of the second conductivity type. The first and second columns of the compensation structure 180 are charged-balanced to a predefined degree. For example, the lateral line integral through a first column deviates by not more than ±20%, by not more than ±10% or even by not more than ±5% from the lateral line integral through a second column in the same lateral plane. The lateral line integrals are taken along a lateral direction perpendicular to a pn junction between the first column and the second column.

Each second column may include compensation layer portions 181 and a bottom compensation region 189, wherein the compensation layer portions 181 and the bottom compensation region 189 may be connected to each other and may be in contact with a same fill structure 190.

The fill structure 190 extends from a top surface of the first floor F1 of the main layer 130 into the main layer 130. The fill structure 190 has stepped sidewalls 191. Each stepped sidewall 191 may include two or more steep sidewall portions 192, which are laterally shifted to each other. The steep sidewall portions 192 may be vertical or may deviate from the vertical direction by up to ±10 degree, by way of example. Flat sidewall portions 193 connect neighboring steep sidewall portions 192. The flat sidewall portions 193 may be lateral or approximately lateral, wherein an angle between each flat sidewall portion 193 and the lateral plane may be in a range from 0 degree to ±25 degree, e.g. from 0 degree to ±10 degree.

The compensation layer portions 181 may extend at uniform thickness along each steep sidewall portion 192 on opposite sides of the fill structure 190. Pairs of compensation layer portions 181 may be formed on opposite sides of the fill structure 190 in the same floor F1, F2, . . . . Compensation layer portions 181 formed in different floors F1, F2, . . . may be laterally shifted to each other. The compensation bottom region 189 extends from a bottom surface 199 of the fill structure 190 into the main layer 130. Each second column may be structurally connected with at least one shielding region 160. For example, a compensation layer portion 181 of a second column may be in direct contact with a shielding region 160.

A lateral width of a compensation layer portion 181 may be in a range from 50 nm to 2 µm. A mean net dopant concentration in a compensation layer portion 181 may be in a range from $10^{17}$ cm$^{-3}$ to $10^{19}$ cm$^{-3}$. The laterally integrated net dopant concentration in each compensation layer portion 181 may be in a range of $10^{12}$ cm$^{-2}$ to $10^{11}$ cm$^{-2}$ or in a range from $5·10^{12}$ cm$^{-2}$ to $2·10^{13}$ cm$^{-2}$ to enable full depletion in the blocking state of the device. For example, the laterally integrated net dopant concentration in each second column and in each first column may be in a range within ±20% of the half breakdown charge of crystalline silicon carbide, e.g., in a range within from $0.8*10^{13}$ cm$^{-2}$ to $1.2*10^{13}$ cm$^{-2}$. For example, a compensation layer portion 181 may have a lateral width of 50 nm and a mean net dopant concentration of $10^{19}$ cm$^{-3}$ or a lateral width of 2 µm and a mean net dopant concentration of $10^{17}$ cm$^{-3}$.

The fill structure 190 may be a homogeneous structure or may be a layered structure including two or more different materials. The fill structure 190 may include dielectric material, conductive material and/or intrinsic semiconductor material.

For example, the fill structures 190 may be completely formed from silicon oxide or may include at least one dielectric material different from silicon oxide, wherein a total temperature coefficient of the fill structure 190 may be closer to the temperature coefficient of single-crystalline silicon carbide than the temperature coefficient of silicon oxide. For example, the fill structures 190 may include at least one of silicon nitride and a silicon oxide. The silicon oxide may include silicon oxide formed by using TEOS (tetraethylorthosilane) as precursor material, a HDP (high density plasma) silicon oxide, and/or an oxide densified after deposition.

Each first column of the superjunction structure 180 may include a compensation region 182. Each compensation region 182 includes a section of the main layer 130 laterally between neighboring second columns. The compensation regions 182 may be substantially uniformly doped along the vertical direction. Each compensation region 182 may include compensation subsections 1821, 1822, . . . . Each compensation subsection 1821, 1822, . . . may be formed in another floor F1, F2, . . . . The vertical extensions of the compensation subsections 1821, 1822, . . . may be equal or may be different.

The mean dopant concentrations in the compensation subsections 1821, 1822, . . . may be equal or may be different. For example, the mean dopant concentration of a compensation subsection 1821, 1822, . . . may depend on the width of the compensation subsection 1821, 1822, . . . . For example, in a narrower compensation subsection 1821, 1822, . . . the mean dopant concentration may be higher as in a wider compensation subsection 1822, 1823, . . . . A higher mean dopant concentration may at least partly compensate a smaller lateral extension with respect to the total amount of dopants in the compensation subsection 1821, 1822, . . . . For example, for each compensation subsection 1821, 1822, . . . the integrated dopant concentration along a lateral cross-sectional line through the respective compensation subsection 1821, 1822, . . . may be in a range of ±10% of the same target value.

Different mean dopant concentrations of the compensation subsection 1821, 1822, . . . in different floors may contribute in precisely shaping the electric field in the blocking mode of the silicon carbide device 500. For example, shifting the electric field maximum towards the vertical center of the superjunction structure may reduce or avoid TRAPATT oscillations in the silicon carbide device.

Each current spread regions 137 may be in direct contact with one or more compensation regions 182. The current spread regions 137 and the first floor F1 of the main layer 130 may have a same dopant concentration or may form a unipolar junction.

A first load electrode 310 at the front side of the silicon carbide body 100 is electrically connected with the source regions 110, the body regions 120, and the shielding regions 160. The gate electrode 155 may be electrically connected to a gate metallization at the front side of the silicon carbide body 100. The gate metallization forms or is electrically connected or coupled to a gate terminal.

Portions of an interlayer dielectric 210 separate the first load electrode 310 and the gate electrode 155 in the gate structures 150. The first load electrode 310 may form or may be electrically connected with or coupled to a first load terminal, which may be an anode terminal of an MCD or a source terminal of an MOSFET.

A second load electrode 320 forms a low-resistive ohmic contact with the contact portion 139. The second load electrode 320 may form or may be electrically connected with or coupled to a second load terminal, which may be a cathode terminal of an MCD or a drain terminal of an MOSFET.

The illustrated silicon carbide device 500 is an n-channel SiC SJ-TMOSFET, wherein the first load electrode 310 forms or is electrically connected or coupled to a source terminal S and wherein the second load electrode 320 forms or is electrically connected or coupled to a drain terminal D. The silicon carbide device 500 includes a plurality of transistor cells TC and a plurality of gate structures 150, wherein the transistor cells TC are electrically connected in parallel.

Figure 8:
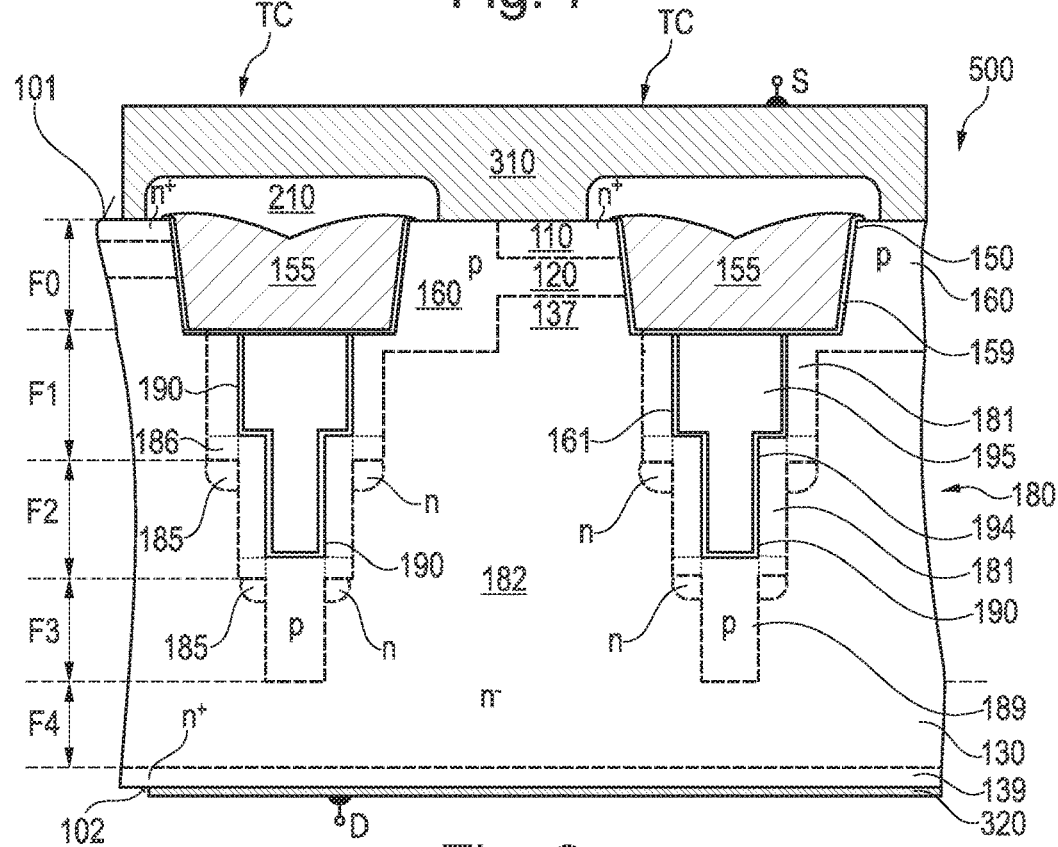

In FIG. 8 the fill structure 190 includes a liner portion 194 separating a fill portion 195 and the silicon carbide body 100. The liner portion 194 may include a conductive material, for example p-doped silicon carbide whereby this doping has to be taken into account choosing the doping levels of the compensation layers so that the desired degree of charge balance is achieved. Alternatively, the liner portion 194 may be a dielectric liner. The fill portion 195 may include dielectric material or conductive material, e.g., doped polycrystalline silicon carbide.

The silicon carbide device 500 further includes compensation adjustment regions 185. Each compensation adjustment regions 185 is formed directly below and in contact with a compensation layer portion 161. Each compensation adjustment regions 185 is formed laterally next to and in contact with another compensation layer portion 161 or with the compensation bottom region 189.

Figure 9:
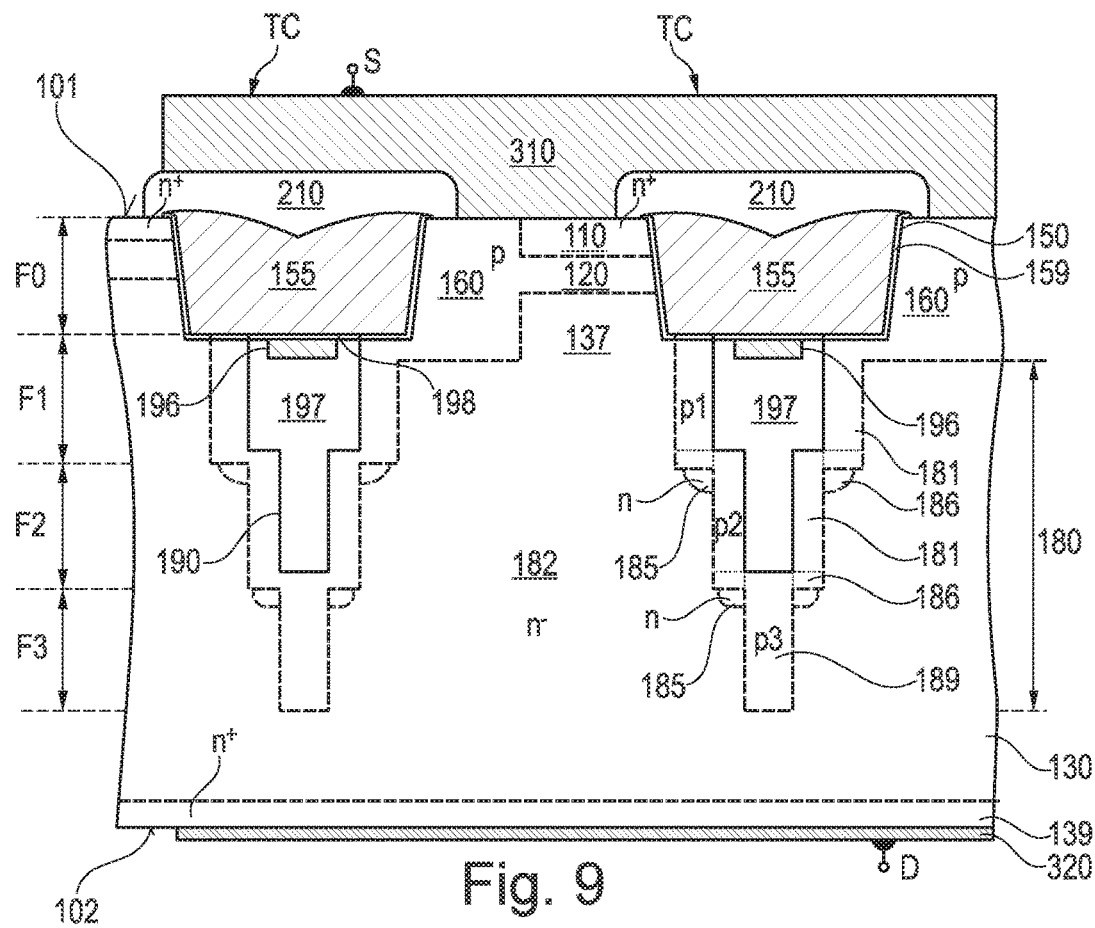

In FIG. 9 the fill structures 190 include a field plate 196. A dielectric portion 197 of the fill structures 190 insulates the field plate 196 and the silicon carbide body 100. The field plate 196 may extend along the complete longitudinal extension of the gate structure 150 and may be electrically connected to the first load electrode 310 in a cross-sectional plane parallel to the illustrated cross-section. The field plate 196 includes a conductive material, for example a metal-containing material, doped polycrystalline silicon or doped polycrystalline silicon carbide. A vertical extension of the field plate 196 may be at most 200 nm, e.g., at most 60 nm. A dielectric structure 198, for example thermally grown silicon oxide may separate the gate electrode 155 and the field plate 196. The field plate 196 may contribute in reducing the electric field strength at the bottom of the gate structure 150 and may enhance the reliability of the gate dielectric 159.

Figure 10:
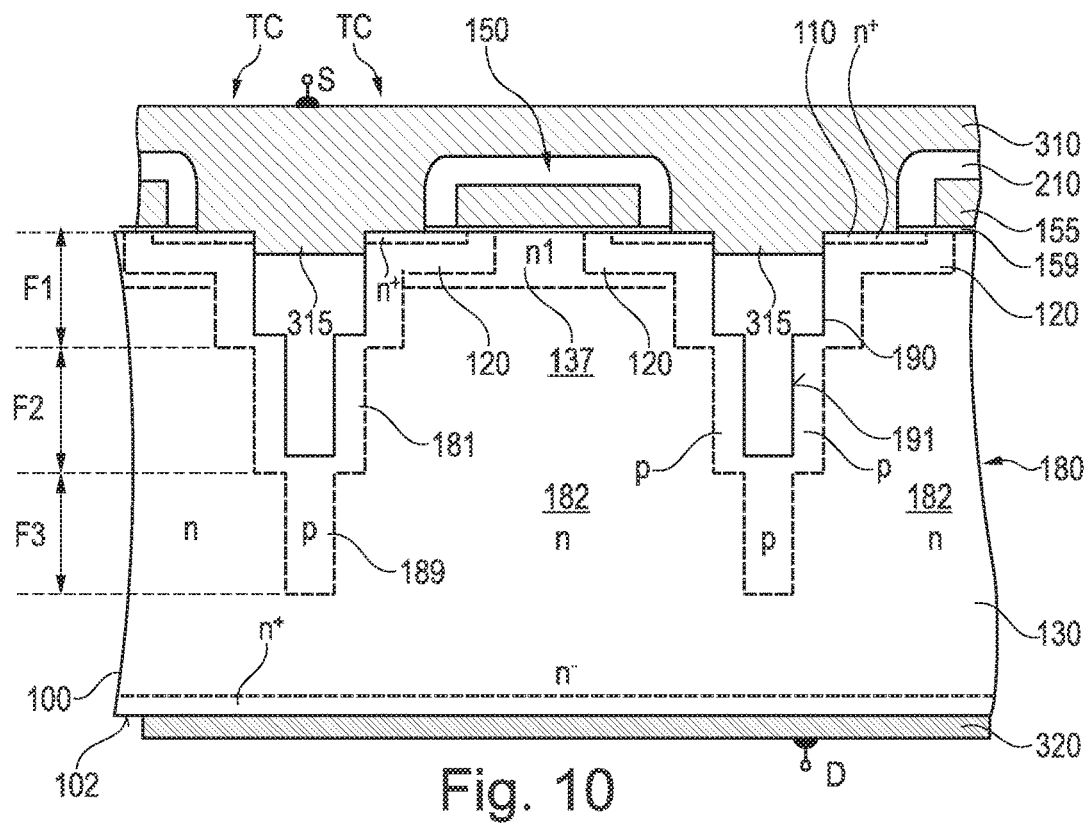
FIG. 10 illustrates a schematic vertical cross-sectional view of a portion of a silicon carbide device with a compensation structure including laterally shifted steep compensation layer portions according to an embodiment concerning transistor cells with planar gate structures.

FIG. 10 illustrates a compensation structure 180 based on fill structures 190 with stepped sidewalls 191 in combination with planar gate structures 150. Two transistor cells TC may be formed within each portion of the silicon carbide body 100 laterally between two neighboring fill structures 190. The two transistor cells TC may be formed symmetrically with respect to a vertical symmetry plane and may share a common planar gate structure 150.

The planar gate structure 150 is formed above a section of the first surface 101 between neighboring fill structures 190. The planar gate structure 150 includes a gate dielectric 159 and a gate electrode 155. The gate dielectric 159 may be directly formed on the first surface 101. The gate electrode 155 may be formed directly on the gate dielectric 159.

Source regions 110, body regions 120 and current spread regions 137 of the transistor cells TC may be formed in an upper section of the first floor F1 of the main layer 130. The body region 120 of the left transistor cell TC directly adjoins a section of the first surface 101 below the gate electrode 155 and may be in contact with the uppermost first compensation portion 181 at the left hand side. The body region 120 of the right transistor cell TC directly adjoins another section of the first surface 101 below the gate electrode 155 and may be in contact with the uppermost first compensation portion 181 at the right hand side. The source regions 110 of the transistor cells TC are formed between the first surface 101 and the respective body region 120. The current spread region 137 is shared between the two transistor cells TC and directly adjoins a section of the first surface 101 directly below a central portion of the gate electrode 155. The current spread region 137 may be in contact with a compensation region 182. For example, the current spread region 137 and the compensation region 182 may form a unipolar junction.

The fill structures 190 may be slightly recessed. Portions of the first load electrode 310 may form contact structures 315 extending from the plane of the first surface 101 into the silicon carbide body 100 down to the recessed fill structure 190. The contact structures 315 may form lateral ohmic contacts with the source regions 110 and with upper sections of the topmost compensation layer portions 181.

Figure 11A:
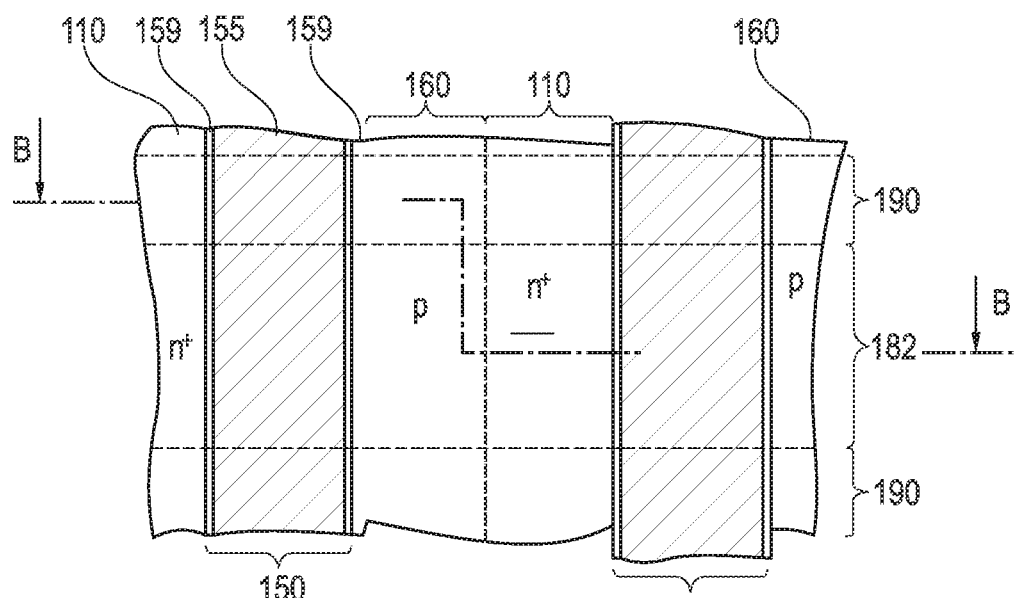
FIGS. 11A-11B are schematic lateral and vertical cross-sectional views of a portion of a SiC SJ-TMOSFET (silicon carbide superjunction trench metal oxide semiconductor field effect transistor) with two-sided channel according to an embodiment.
Figure 11B:
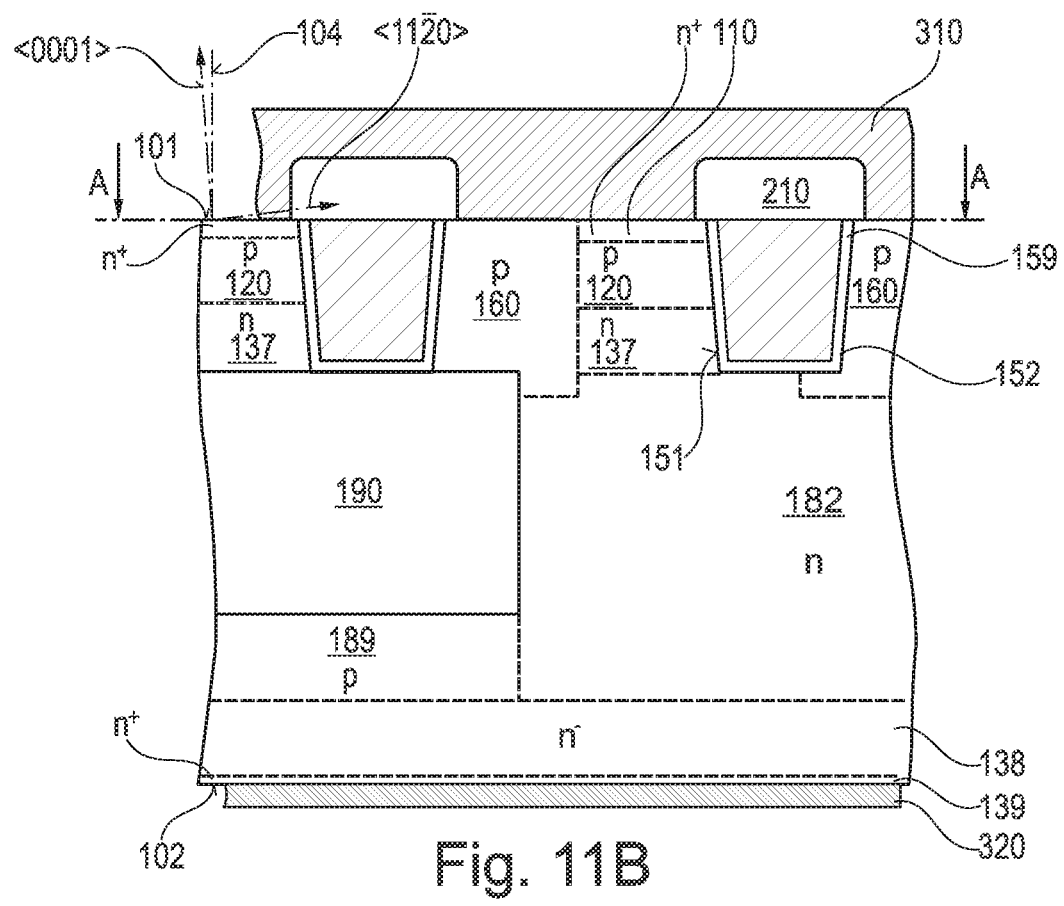

FIGS. 11A-11B show a silicon carbide device 500 with trench gate structures 150 running orthogonal to the fill structures 190.

Figure 12A:
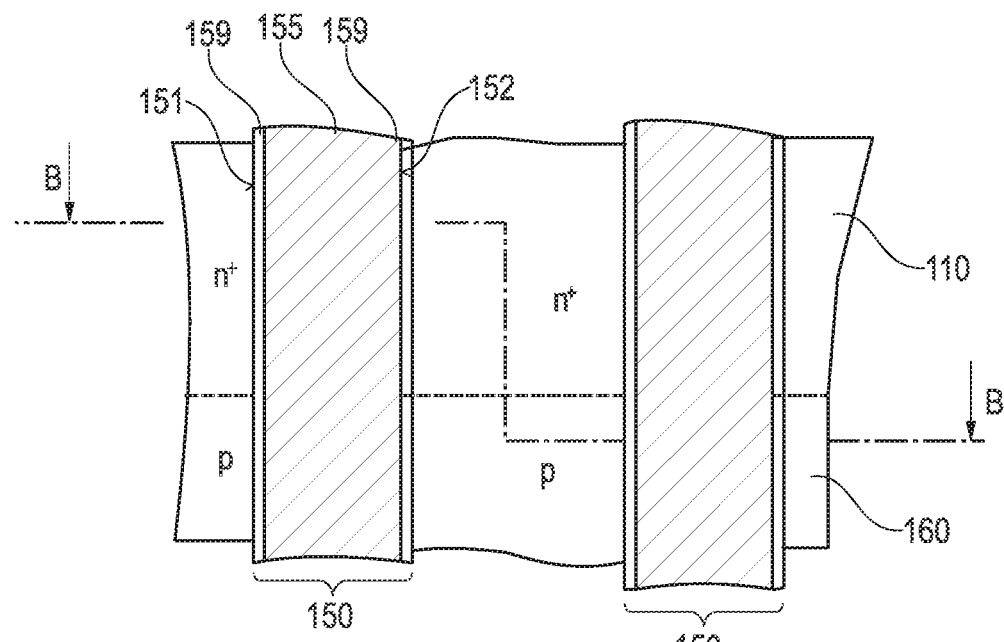
FIGS. 12A-12B are schematic lateral and vertical cross-sectional views of a portion of a SiC SJ-TMOSFET with two-sided channel according to another embodiment.
Figure 12B:
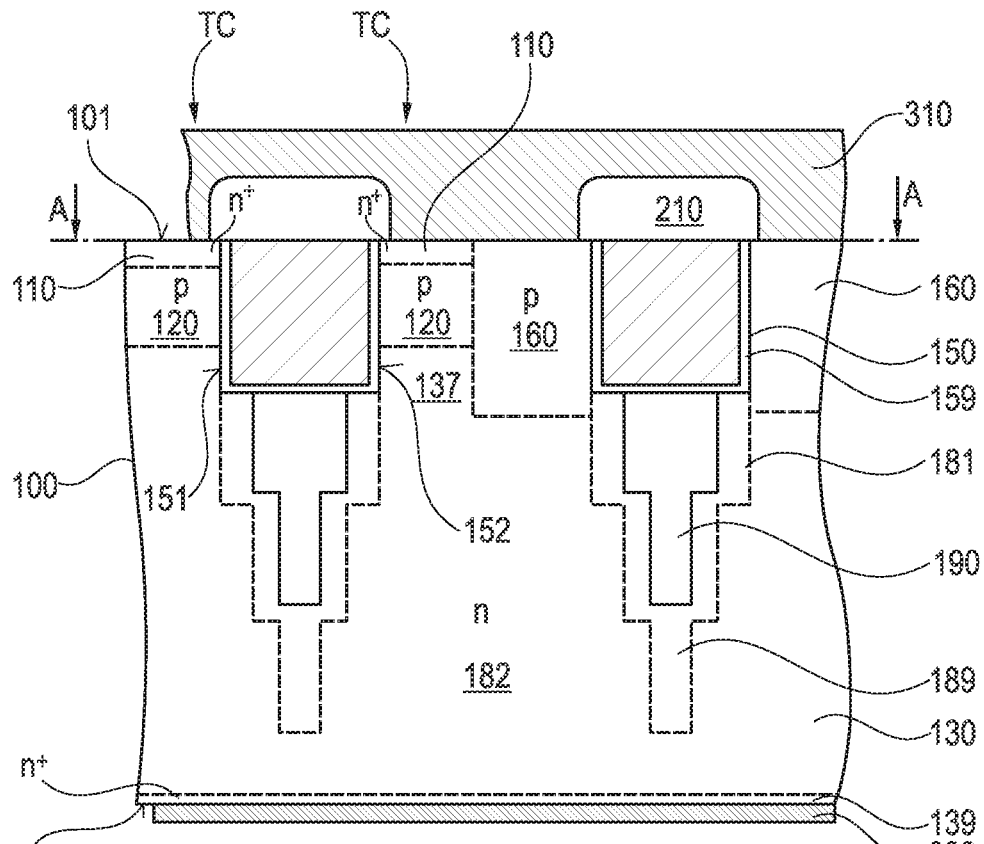

FIGS. 12A-12B show transistor cells TC based on gate structures 150 with two-sided channels and active first and second gate sidewalls 151, 152. Source regions 110, body regions 120, current spread regions 132 and shielding regions 160 may extend from a first gate sidewall 151 of a first gate structure 150 to a second gate sidewall 152 of a second gate structure 150, wherein metal source contact structures may extend from the first surface 101 through the source regions 110 into the body regions 120. Portions including the source regions 110, the body regions 120 and the current spread regions 132 may alternate with shielding regions 160 along a lateral direction parallel to the lateral longitudinal extension of the gate structures 150.

In FIGS. 3A to 12B, three floors F1 to F3 and a top layer F0 are shown. However, these are only examples. The number of floors may be smaller or larger by using more or less process loops of masking, trench etching and implantation steps as described above.

For illustration, various scenarios have been described with respect to a silicon carbide device. Similar techniques may be implemented in semiconductor devices based on other kinds and types of compound semiconductors material for the silicon carbide body, e.g., gallium nitride (GaN) or gallium arsenide (GaAs), etc.

Also for illustration, various techniques have been described with respect to the self-alignment of larger openings in a first process mask with reference to smaller openings in a second process mask. Similar techniques may be implemented in other kinds and types of forming process masks with openings that can be aligned to each other with high precision and high reproducibility on silicon carbide substrates.

What is claimed is:

1. A method of manufacturing a silicon carbide device, comprising:
   implanting first dopants through a larger opening of a first process mask into a silicon carbide body, wherein the larger opening exposes a first surface section of the silicon carbide body;
   forming a trench in the silicon carbide body in a second surface section exposed by a smaller opening in a second process mask, wherein the second surface section is a sub-section of the first surface section, wherein the larger opening and the smaller opening are formed self-aligned to each other, wherein at least part of the first dopants form at least one compensation layer portion extending parallel to a trench sidewall, wherein a vertical extension of the at least one compensation layer portion is equal to or deeper than a vertical extension of the trench sidewall; and
   implanting further first dopants through a trench bottom of the trench,
   wherein the further first dopants form a compensation bottom region extending from the trench bottom into the silicon carbide body.

2. A method of manufacturing a silicon carbide device, comprising:
   implanting first dopants through a larger opening of a first process mask into a silicon carbide body, wherein the larger opening exposes a first surface section of the silicon carbide body; and
   forming a trench in the silicon carbide body in a second surface section exposed by a smaller opening in a second process mask,
   wherein the second surface section is a sub-section of the first surface section,
   wherein the larger opening and the smaller opening are formed self-aligned to each other,
   wherein at least part of the first dopants form at least one compensation layer portion extending parallel to a trench sidewall,
   wherein a vertical extension of the at least one compensation layer portion is equal to or deeper than a vertical extension of the trench sidewall,
   wherein the first dopants are implanted after forming the trench.

3. The method of claim 2, wherein the larger opening is formed by widening the smaller opening.

4. The method of claim 2, wherein forming the trench comprises repeating at least once an etch sequence, wherein the etch sequence comprises forming a trench section in a section exposed by a smaller opening, wherein the smaller opening of the (n+1)th etch sequence is smaller than the smaller opening of the n-th etch sequence.

5. The method of claim 4, wherein the smaller opening of the (n+1)th etch sequence is formed by forming a spacer along a sidewall of the smaller opening of the n-th etch sequence.

6. The method of claim 4, further comprising:
   implanting auxiliary dopants into the silicon carbide body,
   wherein the auxiliary dopants and the first dopants have complementary conductivity types,
   wherein implanting the auxiliary dopants comprises an ion beam implantation with the ion beam tilted with respect to a vertical direction, and
   wherein the implanted auxiliary dopants form compensation adjustment regions at opposite sides of the trench sections.

7. A method of manufacturing a silicon carbide device, comprising:
   implanting first dopants through a larger opening of a first process mask into a silicon carbide body, wherein the larger opening exposes a first surface section of the silicon carbide body;
   forming a trench in the silicon carbide body in a second surface section exposed by a smaller opening in a second process mask, wherein the second surface section is a sub-section of the first surface section, wherein the larger opening and the smaller opening are formed self-aligned to each other, wherein at least part of the first dopants form at least one compensation layer portion extending parallel to a trench sidewall, wherein a vertical extension of the at least one compensation layer portion is equal to or deeper than a vertical extension of the trench sidewall; and
   forming a transistor cell that comprises a source region and a body region,
   wherein the source region and the body region form a pn junction, and
   wherein the source region and the body region are formed between a first surface of the silicon carbide body and the at least one compensation layer portion.

8. The method of claim 7, further comprising a current spread region that is lateral to the trench sidewall.

9. The method of claim 7, wherein the transistor cell includes a planar gate structure.

10. A method of manufacturing a silicon carbide device, comprising:

implanting first dopants through a larger opening of a first process mask into a silicon carbide body, wherein the larger opening exposes a first surface section of the silicon carbide body;

forming a trench in the silicon carbide body in a second surface section exposed by a smaller opening in a second process mask, wherein the second surface section is a sub-section of the first surface section, wherein the larger opening and the smaller opening are formed self-aligned to each other, wherein at least part of the first dopants form at least one compensation layer portion extending parallel to a trench sidewall, wherein a vertical extension of the at least one compensation layer portion is equal to or deeper than a vertical extension of the trench sidewall; and after forming the trench, implanting supplementary dopants of the conductivity type of the first dopants into the silicon carbide body, wherein implanting the supplementary dopants comprises an ion beam implantation with the ion beam tilted with respect to a vertical direction, wherein the implanted supplementary dopants form connection regions, and wherein each connection region is in contact with and/or overlaps two neighboring compensation layer portions.

11. A method of manufacturing a silicon carbide device, comprising:

forming a first compensation region of a superjunction structure by repeating at least once a first implant/etch sequence, the first implant/etch sequence comprising:
implanting first dopants of a first conductivity type through a larger opening of a first process mask into a silicon carbide body, wherein the larger opening exposes a first surface section of the silicon carbide body; and
forming a trench in the silicon carbide body in a second surface section exposed by a smaller opening in a second process mask,
wherein the second surface section is a sub-section of the first surface section,
wherein the larger opening and the smaller opening are formed self-aligned to each other,
wherein at least part of the first dopants form the first compensation region of a superjunction structure extending parallel to a trench sidewall; and
wherein a second compensation region of a second conductivity type formed in the silicon carbide body adjoins the first compensation region of the superjunction structure.

12. The method of claim 11, wherein the trench sidewall is a stepped trench sidewall.

13. The method of claim 11, wherein the first compensation region of the superjunction structure and the second compensation region of the superjunction structure form a vertical pn junction having a step.

* * * * *